US006846149B2

United States Patent
Savage et al.

(10) Patent No.: US 6,846,149 B2
(45) Date of Patent: Jan. 25, 2005

(54) SEMICONDUCTOR WAFER PROCESSING SYSTEM WITH VERTICALLY-STACKED PROCESS CHAMBERS AND SINGLE-AXIS DUAL-WAFER TRANSFER SYSTEM

(75) Inventors: Richard N. Savage, Scotts Valley, CA (US); Frank S. Menagh, Santa Cruz, CA (US); Helder R. Carvalheira, Scotts Valley, CA (US); Philip A. Troiani, Santa Cruz, CA (US); Dan L. Cossentine, Santa Cruz, CA (US); Eric R. Vaughan, Santa Cruz, CA (US); Bruce E. Mayer, Soquel, CA (US)

(73) Assignee: Aviza Technology, Inc., Scotts Valley, CA (US)

( * ) Notice: Subject to any disclaimer, the term of this patent is extended or adjusted under 35 U.S.C. 154(b) by 187 days.

(21) Appl. No.: 09/996,869

(22) Filed: Nov. 27, 2001

(65) Prior Publication Data

US 2002/0033136 A1 Mar. 21, 2002

Related U.S. Application Data

(62) Division of application No. 09/483,945, filed on Jan. 13, 2000.
(60) Provisional application No. 60/127,532, filed on Apr. 2, 1999, and provisional application No. 60/127,650, filed on Apr. 2, 1999.

(51) Int. Cl.[7] .............................. B25J 15/10; F26B 3/08
(52) U.S. Cl. ...................... 414/416; 414/217; 414/941
(58) Field of Search ..................... 414/217, 46, 935, 414/941; 118/719

(56) References Cited

U.S. PATENT DOCUMENTS

| 3,220,331 A | 11/1965 | Evans et al. |
| 4,423,701 A | 1/1984 | Nath et al. |
| 4,816,098 A | 3/1989 | Davis et al. |
| 4,822,756 A | 4/1989 | Hirayama |
| 4,934,315 A | 6/1990 | Linnebach et al. |

(List continued on next page.)

FOREIGN PATENT DOCUMENTS

| DE | 297 16 440 U1 | 1/1998 |
| EP | 0824266 A2 | 2/1998 |
| JP | 08046013 | 2/1996 |
| JP | 10107124 | 4/1998 |

*Primary Examiner*—Eileen D. Lillis
*Assistant Examiner*—Charles A. Fox
(74) *Attorney, Agent, or Firm*—Dorsey & Whitney LLP

(57) ABSTRACT

A semiconductor wafer processing system including a multi-chamber module having vertically-stacked semiconductor wafer process chambers and a loadlock chamber dedicated to each semiconductor wafer process chamber. Each process chamber includes a chuck for holding a wafer during wafer processing. The multi-chamber modules may be oriented in a linear array. The system further includes an apparatus having a dual-wafer single-axis transfer arm including a monolithic arm pivotally mounted within said loadlock chamber about a single pivot axis. The apparatus is adapted to carry two wafers, one unprocessed and one processed, simultaneously between the loadlock chamber and the process chamber. A method utilizing the disclosed system is also provided.

6 Claims, 16 Drawing Sheets

U.S. PATENT DOCUMENTS

| | | | |
|---|---|---|---|
| 5,058,526 A | 10/1991 | Matsushita et al. | |
| 5,259,881 A | 11/1993 | Edwards et al. | |
| 5,275,709 A | 1/1994 | Anderle et al. | |
| 5,364,222 A * | 11/1994 | Akimoto et al. | 414/416.03 |
| 5,516,367 A | 5/1996 | Lei et al. | |
| 5,518,542 A * | 5/1996 | Matsukawa et al. | 118/52 |
| 5,558,717 A | 9/1996 | Zhao et al. | |
| 5,588,827 A | 12/1996 | Muka | |
| 5,607,276 A | 3/1997 | Muka et al. | |
| 5,612,068 A * | 3/1997 | Kempf et al. | 425/574 |
| 5,613,821 A | 3/1997 | Muka et al. | |
| 5,664,254 A | 9/1997 | Ohkura et al. | |
| 5,664,925 A | 9/1997 | Muka et al. | |
| 5,751,003 A | 5/1998 | Rose et al. | |
| 5,778,968 A | 7/1998 | Hendrickson et al. | |
| 5,879,459 A | 3/1999 | Gadgil et al. | |
| 5,893,699 A * | 4/1999 | Dadiomov | 414/729 |
| 5,954,472 A * | 9/1999 | Hofmeister et al. | 414/744.5 |
| 6,045,315 A | 4/2000 | Azumano et al. | |
| 6,073,366 A | 6/2000 | Aswad | |
| 6,200,389 B1 | 3/2001 | Miller et al. | |
| 6,585,478 B1 * | 7/2003 | Wood et al. | 414/806 |

\* cited by examiner

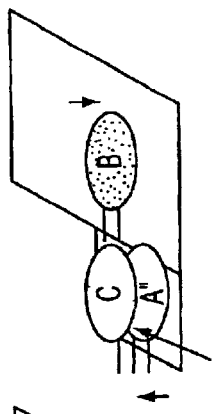
FIG. 16A
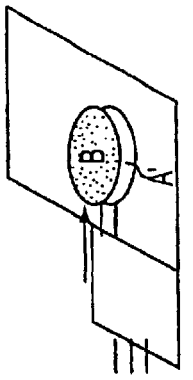
FIG. 16B
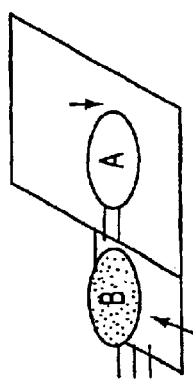
FIG. 16C
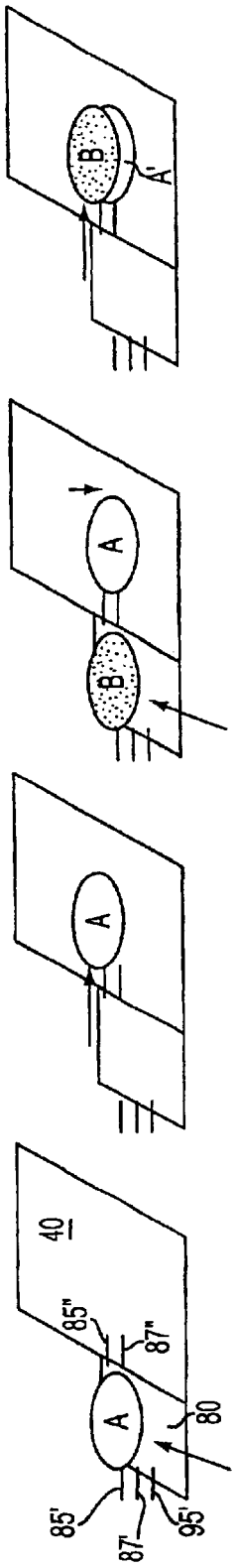
FIG. 16D
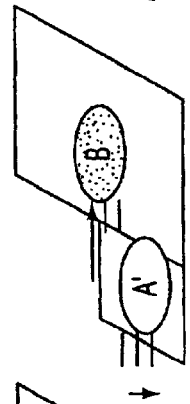
FIG. 16E
FIG. 16F
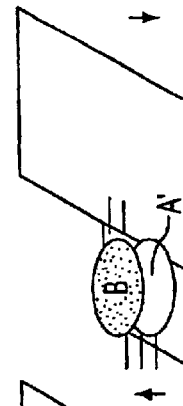
FIG. 16G
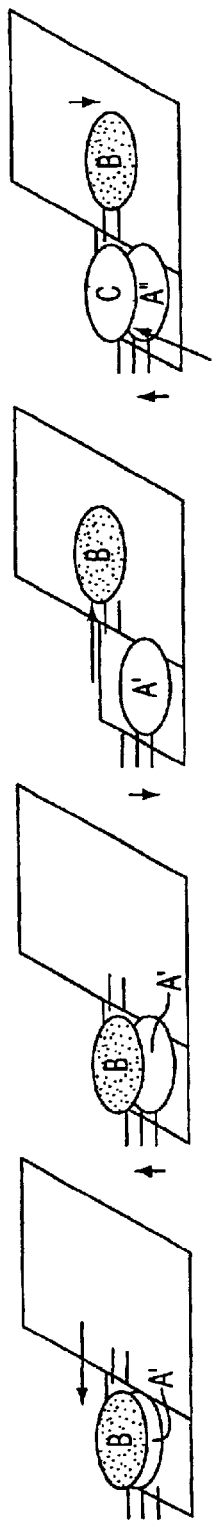
FIG. 16H
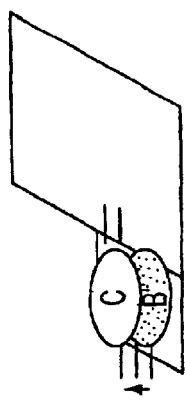
FIG. 16I
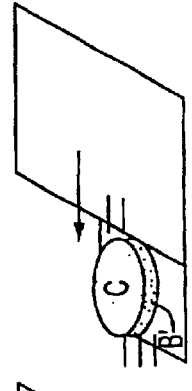
FIG. 16J
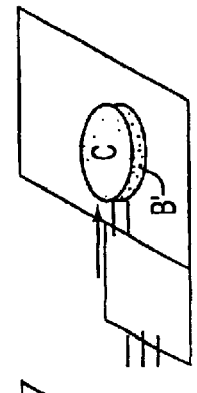
FIG. 16K
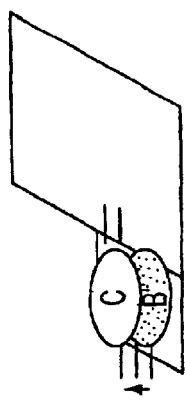
FIG. 16L THEN REPEAT LIKE SEQUENCE FROM (g)

SEMICONDUCTOR WAFER PROCESSING SYSTEM WITH VERTICALLY-STACKED PROCESS CHAMBERS AND SINGLE-AXIS DUAL-WAFER TRANSFER SYSTEM

CROSS REFERENCE TO RELATED APPLICATIONS

This is a division of application Ser. No. 09/483,945 filed Jan. 13. 2000.

This application claims priority to U.S. Provisional Patent Application Ser. No. 60/127,532 filed Apr. 2, 1999, entitled NEAR ATMOSPHERIC CVD SYSTEM WITH VERTICALLY-STACKED PROCESS CHAMBERS.

This application also claims priority to U.S. Provisional Patent Application Ser. No. 60/127,650 filed Apr. 2, 1999, entitled SINGLE-AXIS DUAL-WAFER TRANSFER SYSTEM.

BACKGROUND OF THE INVENTION

1. Field of the Invention

This invention relates generally to semiconductor wafer processing systems, apparatuses, and methods. In particular, the present invention relates to a structure with vertically-stacked process chambers which minimize the footprint while maximizing throughput of a semiconductor wafer processing system. For example, the present invention may be used to translate wafers within a near-atmospheric chemical vapor deposition (CVD) system, a rapid thermal oxidation system, or other types of wafer processing systems. The invention also particularly relates to a wafer transfer apparatus and method that moves semiconductor wafers between a loadlock chamber and a process chamber using a unitary transfer arm which pivots about a single rotational axis.

2. Description of Related Art

Conventionally, wafer transfer between loadlock chambers and process chambers is performed by complex apparatus. The complexity of the machinery has resulted in high cost of the apparatus, slow wafer processing and a short mean time between failures.

One example of a conventional wafer processing system is U.S. Pat. No. 4,934,315 to Linnebach et al. for "System for Producing Semiconductor Layer Structures By Way of Epitaxial Growth". This multiple reactor chamber system accepts wafers for processing, where the wafers are loaded into respective holders in an atmospheric handler. The holders and wafers are stacked in a load chamber where each holder, carrying its respective wafer, is subsequently transferred along a linear path through the multiple reactor chambers. The reactor chambers are horizontally aligned along the linear path.

U.S. Pat. No. 4,822,756 to Hirayama for "Reaction Furnace and Method of Operating the Same" discloses a reaction furnace including a wafer support boat which rolls from an elevator capsule through a loading chamber and into a treatment chamber. Although the loading chambers and the treatment chambers appear to be stacked in a vertical direction, the pressure gas system and vacuum system are horizontally disposed from the treatment chambers and thus disadvantageously increases the footprint of the reaction furnace.

U.S. Pat. No. 4,423,701 to Nath et al. for "Glow Discharge Deposition Apparatus Including a Non-Horizontally Disposed Cathode" discloses a multiple chamber glow discharge deposition apparatus having deposition chambers which vertically orient the wafers or substrates for processing. The deposition chambers are shown to be horizontally oriented with respect to one another. A rotatable arm expels the substrates from the chamber such that the arm pushes the substrates in one direction along channeled guides.

U.S. Pat. No. 4,816,098 to Davis et al. for "Apparatus for Transferring Workpieces" discloses a system in which wafers are loaded onto the system in a vacuum wafer carrier which is held under vacuum to reduce contamination of the wafers. The wafers are transferred into a cluster tool having multiple process modules via a vacuum loadlock and a 2-axis robot arm which only has the capability of transporting a single wafer at a time.

U.S. Pat. No. 5,664,254 to Ohkura et al. for "Substrate Processing Apparatus and Substrate Processing Method" discloses a stacking arrangement for a plurality of process units. Although the process units may be vertically stacked, only one main handler is provided for transferring substrates to each of the process units, whereby the throughput of each process unit cannot be maximized. The patent also discloses a plurality of holding arms arranged in a 3-stage structure for transferring a substrate or wafer. The holding arms are mounted on the main handler and are actuated by a complex arrangement including a vertical drive shaft and motor in combination with a horizontally oriented convey base having a drive motor and belt to actuate each holding arm.

U.S. Pat. No. 5,058,526 to Matsushita et al. for "Vertical Load Lock Reduced-Pressure Type Chemical Vapor Deposition Apparatus" discloses a loading/unloading chamber which is similar to a loadlock chamber found in a conventional cluster tool. A cooler including refrigerant-circulating tubes located in an unloading part of a loading/unloading chamber cools the treated wafers.

U.S. Pat. No. 5,664,925 to Muka et al. for "Batchloader for Load Lock" discloses a conventional single-wafer scissor-type transfer arm. Similar conventional single-wafer scissor-type transfer arms are disclosed by U.S. Pat. No. 5,613,821 to Muka et al. for "Cluster Tool Batchloader of Substrate Carrier" and U.S. Pat. No. 5,607,276 to Muka et al. for "Batchloader for Substrate Carrier on Load Lock".

U.S. Pat. No. 5,778,968 to Hendrickson et al. for "Method for Heating or Cooling Wafers" discloses a method for heating or cooling a substrate enclosed vacuum chamber using gas having an adjustable pressure above the wafer. Similarly, U.S. Pat. No. 5,588,827 to Muka for "Passive Gas Substrate Thermal Conditioning Apparatus and Method" discloses a heat transfer plate, located in a thermal conditioning chamber, which is either heated or cooled to change the temperature of a substrate.

SUMMARY OF THE INVENTION

A semiconductor substrate or wafer processing system and a substrate or wafer transfer apparatus in accordance with the present invention overcomes the disadvantages of conventional systems discussed above. In accordance with the present invention, a semiconductor wafer processing system includes a multi-chamber module, the multi-chamber module having a plurality of vertically-stacked loadlock-process chamber assemblies, an atmospheric-pressure front end unit having an atmospheric-pressure front end robot for transporting semiconductor wafers between a wafer cassette and the loadlock-process chamber assemblies, a common process chemical delivery system for each stack of chamber assemblies, and a dedicated wafer transfer apparatus for each loadlock-process chamber assembly. The processing system may also include two or more multi-chamber modules oriented in a linear array. A loadlock chamber is dedicated to each process chamber, the chambers together forming a respective loadlock-process chamber assembly. A cooling plate is disposed within each loadlock chamber below a single-pivot transfer arm of the wafer transfer apparatus. The cooling plate is provided with lift pins for removing wafers from the pivot transfer arm. A wafer chuck assembly having a chuck clamping surface and pins is provided within each process chamber for positioning wafers within the process chamber. In one embodiment of the present invention, the wafer chuck assembly translates a wafer within the process chamber past a chemical vapor deposition injector for processing.

One wafer transfer apparatus serves each loadlock-process chamber assembly. Each wafer transfer apparatus includes a transfer arm adapted to carry and transfer two or more wafers between the loadlock chamber and the process chamber. The transfer arm pivots about a single pivot axis extending through the loadlock chamber. The transfer apparatus has the capacity to simultaneously carry two wafers between the loadlock chamber and the process chamber. The wafer transfer apparatus also includes a retracted/home position and an extended position, wherein the single pivot axis allows the transfer arm to pivot between the retracted and extended positions. The cooling plate is disposed below the pivot arm when the pivot arm is in the retracted position. The wafer transfer apparatus also includes a lower wafer shelf and an upper wafer shelf integrated within the transfer arm.

Another aspect of the present invention is directed to a method of transferring the unprocessed wafer from the loadlock chamber to the process chamber, transferring the unprocessed wafer from the upper wafer shelf to a semiconductor wafer chuck mounted in the process chamber, translating the semiconductor wafer chuck from a retracted position, to an extended position where the wafer is processed, simultaneously transferring the processed wafer and a second unprocessed wafer between the loadlock chamber and the process chamber, and transferring the processed wafer from the lower wafer shelf to the cooling plate.

It is an object of the present invention to provide a wafer processing system having multiple loadlock-process chamber assemblies, each assembly having one loadlock chamber dedicated to a process chamber and a dedicated transfer arm which moves wafers between respective loadlock and process chambers.

It is an object of the present invention to vertically stack two or more loadlock-process chamber assemblies to form a multi-chamber module in order to reduce the system footprint and thus optimize the vertical orientation and layout of the loadlock-process chamber assembly stacks.

It is another object of the present invention to align the multi-chamber modules in a linear fashion with a single atmospheric-pressure front end wafer transfer system delivering substrates to all loadlock chambers to optimize the footprint of the processing system.

It is another object of the present invention to provide a common process chemical delivery system and local control system for each multi-chamber module.

It is another object of the present invention to optimize wafer flow paths and process timing for a linear array, vertically-stacked processing system and method in order to maximize throughput of each process chamber and of the full processing system.

It is another object of the present invention to optimize the number of process chambers within a footprint to increase processing system throughput.

It is a further object of the present invention to provide a new wafer transfer arm and wafer transfer method which moves semiconductor wafers from a single atmospheric-pressure front end robot, through a loadlock chamber, and into a wafer process chamber, in which the transfer arm pivots about a single rotational axis with one pivot point located on the transfer arm to side-load the process chamber.

It is another object of the present invention to provide a transfer arm having the capacity to carry two wafers in order to facilitate and expedite wafer transfer between the loadlock chamber and the process chamber. In particular, it is an object of the present invention to provide a transfer arm which has the capacity to carry an unprocessed wafer and a processed wafer at the same time in order to maximize system throughput.

It is another object of the present invention to provide a wafer cooling plate to reduce wafer cooling time after a wafer is processed to facilitate wafer transfer out of the loadlock and into a cassette maximizing parallel steps within the processing system and thus increasing throughput of the processing system.

BRIEF DESCRIPTION OF THE DRAWINGS

The foregoing and other objects of the invention will be more clearly understood from the following description when taken in conjunction with the accompanying drawings of which:

FIGS. 16(*a*) through 16(*l*) schematically show a wafer transfer sequence in accordance with the present invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The present invention is directed to a new processing system for processing semiconductor wafers or substrates. It is noted that the term "wafers" is intended to refer to both wafers and substrates for the purposes of the present invention. The present invention is directed to a system, apparatus, and method which may be used in conjunction with various wafer processes including, but not limited to, near-atmospheric chemical vapor deposition (CVD) or rapid thermal oxidation processes. In the case that such CVD processes are utilized, the CVD processes may include deposition processing pressures generally between about 5 Torr and about 760 Torr, more typically between about 100 Torr and about 700 Torr, and usually between about 200 Torr and 600 Torr. One should appreciate that the process chambers of the present invention may also operate at lower vacuum pressures in the milli-Torr regime. For example, the addition of suitable vacuum pumps would allow the present invention to operate in the 10 m Torr to 200 m Torr range, and more generally in the 10 m Torr to 5 Torr range.

Figure 1:
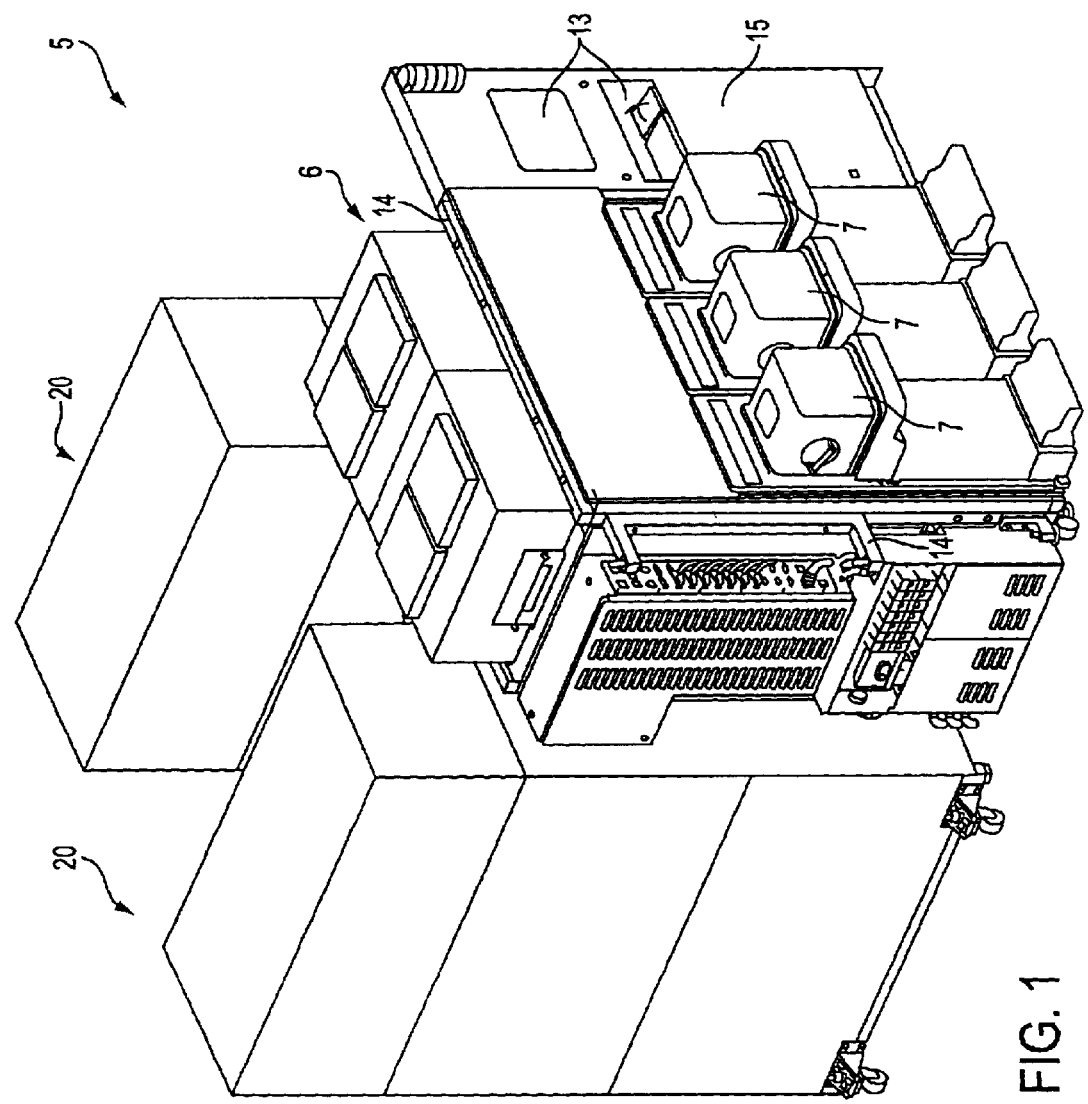
FIG. 1 is a perspective view of a processing system in accordance with the present invention.
Figure 2:
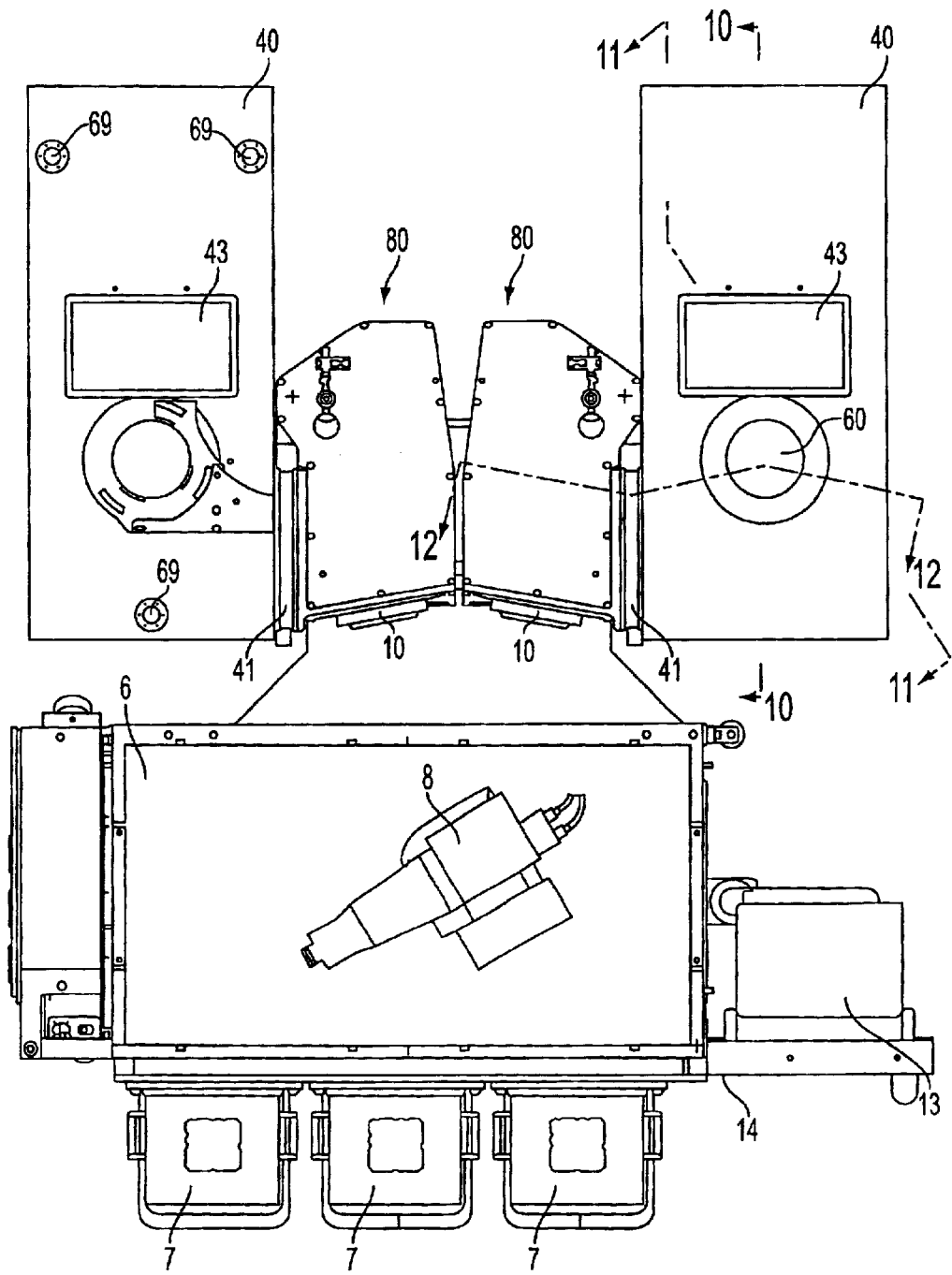
FIG. 2 is a plan view of the processing system shown in FIG. 1.
Figure 3:
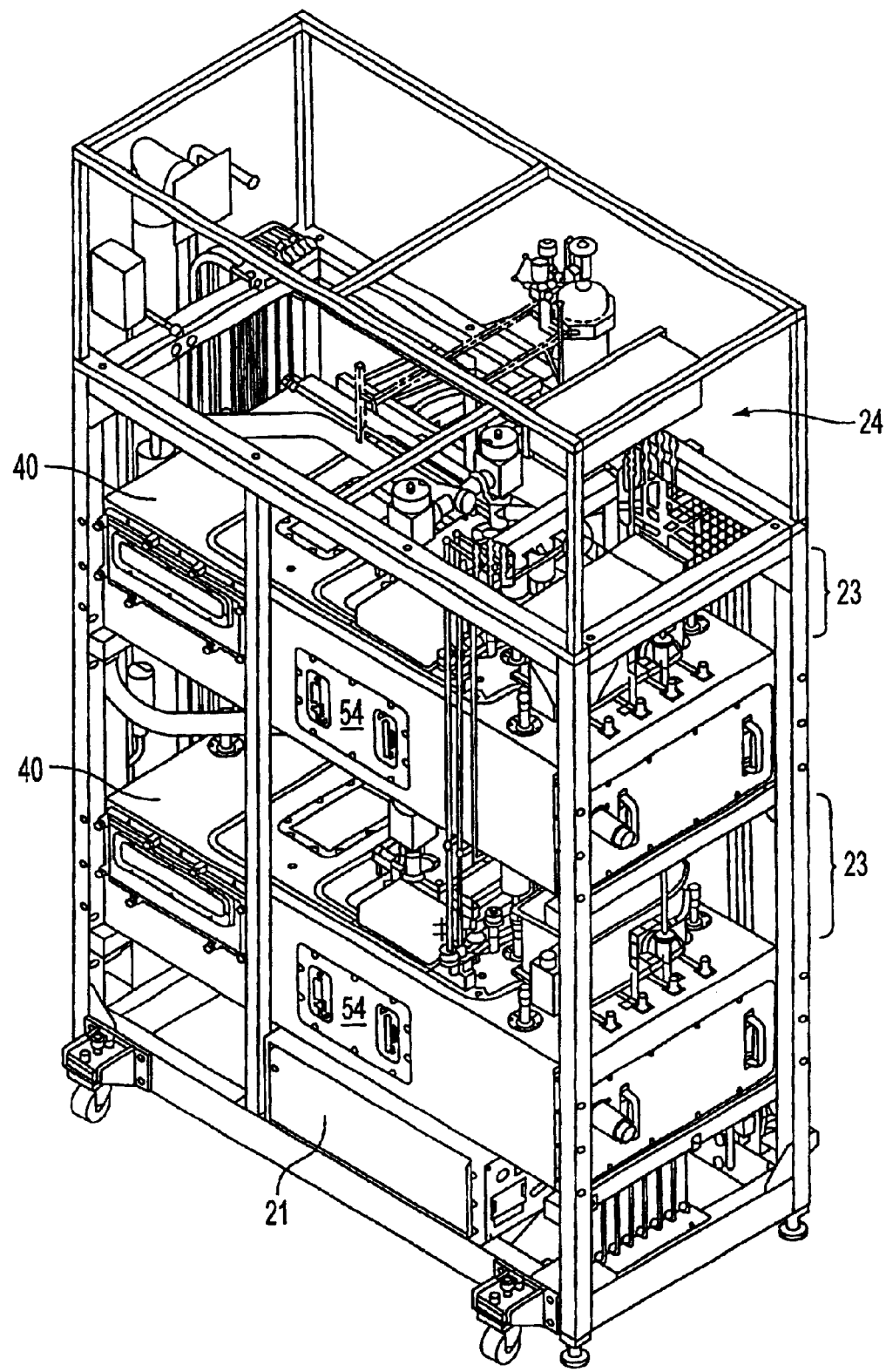
FIG. 3 is a perspective view of a multi-chamber module in accordance with the present invention.

Referring to FIGS. 1–3, the major components of the semiconductor wafer processing system 5 of the present invention include an atmospheric-pressure front end (AFE) unit 6, a multi-chamber module (MCM) 20 having vertically stacked sets of process chambers 40, a common process chemical delivery system 24 and a common control system 21 which are shared by sets of stacked process chambers 40, and loadlock chambers 80 for semiconductor wafer transfer between a respective process chamber 40 and the atmospheric pressure front end unit 6.

Atmospheric-pressure front end unit 6 is located at the front of wafer processing system 5 and is coplanar with a clean room wall (not shown). Atmospheric-pressure front end unit 6 includes one or more wafer cassettes or load ports 7. Such wafer cassettes are conventional and known in the art. An AFE robot 8 transfers wafers between cassettes 7, a wafer aligner 9 (not shown in FIGS. 1–3 but shown in FIG. 14), and loadlock chambers 80. Robot 8 returns wafers to their respective cassettes 7 on completion of processing. The wafer aligner is provided for wafer centering and notch alignment prior to transferring the wafers into loadlock chambers 80. These components are housed in a rigid frame 14 which defines a clean environment with the appropriate environmental air handling equipment. The front surface of the AFE unit 6 incorporates the system facade 15, which also supports a user interface panel and display 13.

Figure 12:
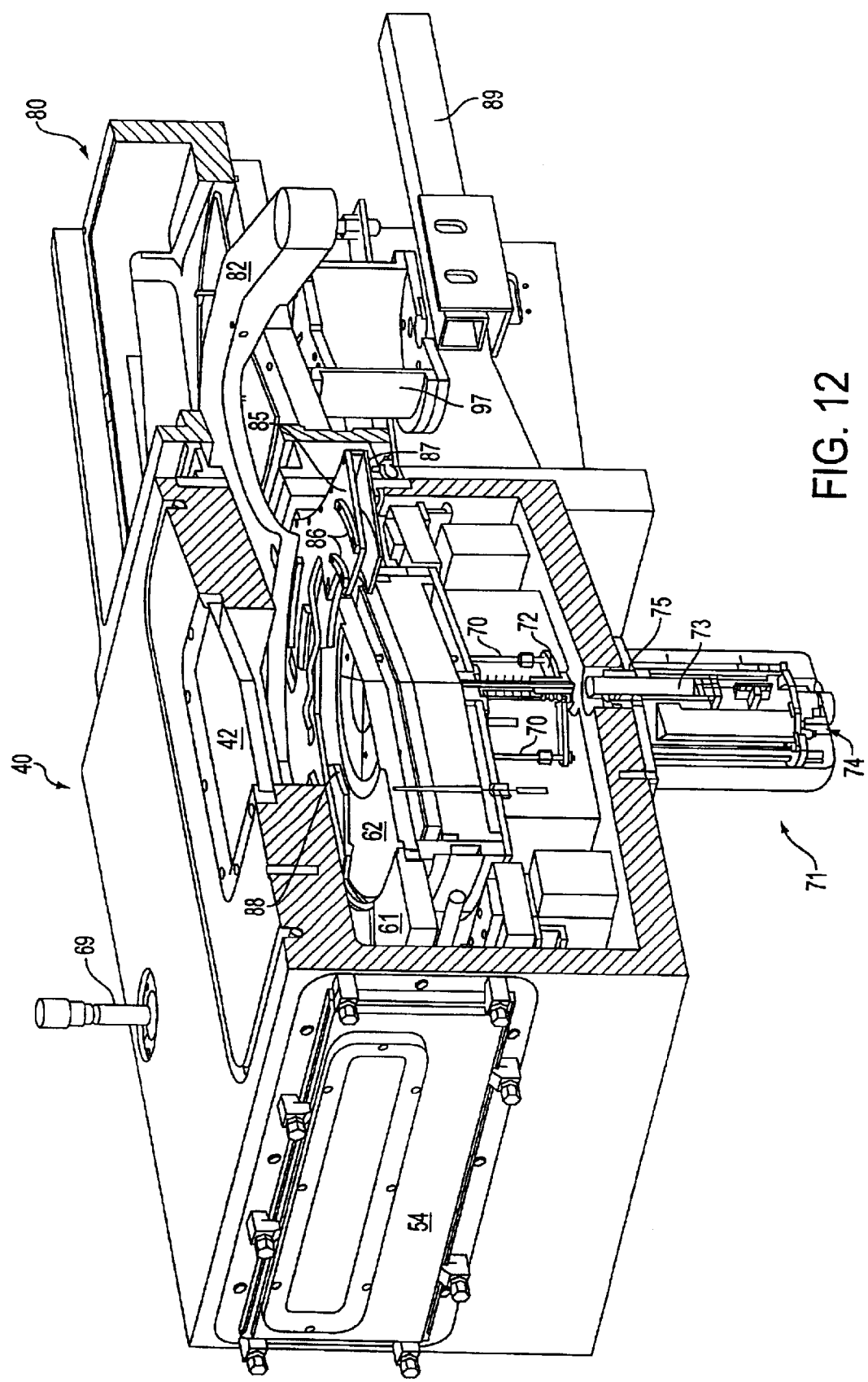
FIG. 12 is a perspective sectional view of a loadlock-process chamber assembly including the loadlock and process chambers of FIG. 2 taken along line 12 12 of FIG. 2.

Referring to FIGS. 2 and 12, one loadlock chamber 80 is provided for each process chamber 40. Loadlock chamber supports 89, shown in FIG. 8, position each loadlock chamber 80 relative to a respective process chamber 40. Wafers are moved between AFE unit 6 and each process chamber 40 through a respective loadlock chamber 80. A front end gate valve 10 connects each loadlock chamber 80 and AFE unit 6. Front end gate valve 10 also hermetically seals loadlock chamber 80 from AFE unit 6 such that loadlock chamber 80 may be evacuated. A process chamberslot valve 41 is likewise provided connecting loadlock chamber 80 to a respective process chamber 40. Process chamber slot valve 41 hermetically seals process chamber 40 from loadlock chamber 80 such that loadlock chamber 80 may be vented to atmospheric-pressure without disturbing the pressure of process chamber 40.

Central to the present invention is the concept of providing each process chamber with its own dedicated loadlock chamber and wafer transfer arm to maximize the throughput both of each process chamber and that of the entire processing system. The present invention further ensures maximum throughput of the processing system in situations where substrate processing requires time to cool wafers after processing.

Typically, a loadlock serves as a buffer between two different environments, for example, between a room temperature, atmospheric-pressure environment and an elevated temperature, evacuated environment. Thus, the loadlock requires some non-zero operating time to adjust the environment of the loadlock chamber to first match one environment in which the loadlock can accept a substrate and then to subsequently match a second environment to transfer the substrate to a process chamber. Although no substrate processing is performed in the loadlock, the substrate must "wait" or spend some non-zero time within the loadlock chamber. Typically, this time is on the order of tens of seconds, and possibly as much as several minutes.

Figure 4:
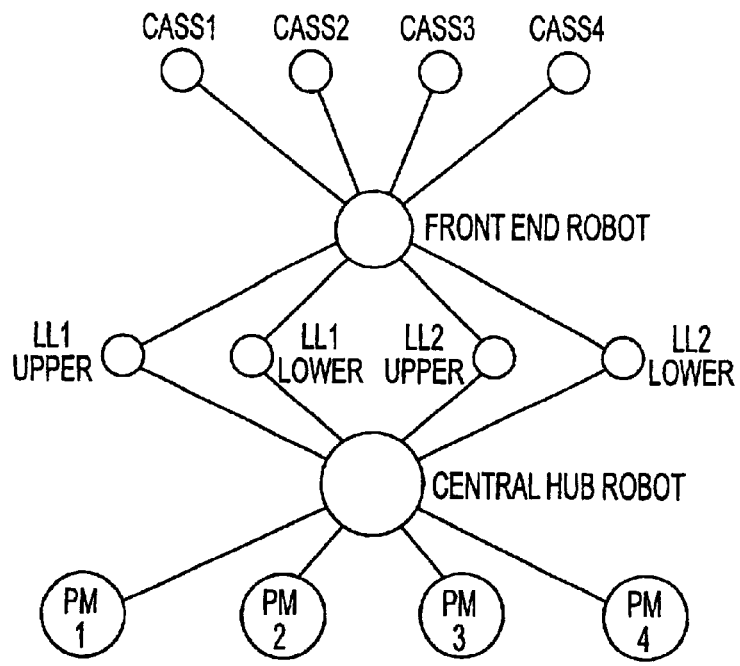
FIG. 4 is a diagrammatic illustration showing a wafer flow path diagram of a conventional cluster tool system.

Prior art approaches as illustrated in FIG. 4 typically include a front end robot that delivers substrates to one or more loadlocks. A second robot, often in a chamber hub, then transports substrates between any one of the loadlocks and any one of several process chambers. The front end robot may be used to transport substrates to an aligner prior to entering a loadlock, however, the central hub robot may instead transport the substrate from a loadlock to an aligner prior to transferring the wafer to a process chamber. Regardless, each robot has responsibility for distribution of wafers between multiple modules. Software scheduling is possible for prior processing systems using two robots and is often used in prior art approaches. However, as indicated in FIG. 4, the scheduling can be quite complex.

FIG. 4 illustrates an example of a prior art wafer flow path diagram corresponding to a prior art processing system which includes four load cassettes CASS 1, CASS 2, CASS 3, CASS 4, a Front End Robot, four loadlock chambers LL1 UPPER, LL1 LOWER, LL2 UPPER, LL2 LOWER, a Central Hub Robot, and four process chambers PM1, PM2, PM3, PM4. Because a single central hub robot transfers the wafers between all the loadlock chambers and all the process chambers, the number of possible wafer flow paths in such a system totals sixty-four (64). For example, four possible "load cassette/front end robot" paths multiplied by four possible "front end robot/loadlock/central hub robot" paths multiplied by four possible "central robot/process chamber" paths equals sixty-four (64) possible paths.

In some applications, processed wafers may need to be cooled prior to being returned to the load cassettes. Prior art practice typically includes one or more cooling chambers, or "wait" positions where wafers may sit and cool, that are within reach of the central hub robot only. Limiting transportation of hot wafers within the reach of only the central hub robot minimizes the apparatus requiring special materials to handle hot wafers (for example, end effectors, wafer holders and surfaces, cassettes, etc.), and thus minimizes cost.

However, the addition of a cooling chamber or a position where the wafer must "wait" and cool further complicates the scheduling of wafers moved by the central hub robot, and thus also complicates the scheduling of the central hub robot with respect to that of the front end robot. Typically, the front end robot and the central hub robot each can transport wafers very quickly. However, each robot is paced by the "readiness" of the wafers, and scheduling optimization of such prior art systems thus requires very precise timing and requires extensive feedback and/or "look ahead" prediction regarding utilization of the various process chambers and loadlocks to minimize "waiting" times and thus to ensure highest throughput through the system. Often, in practice, even the slightest pause in wafer transfer to one process chamber (or loadlock) can disrupt overall wafer flow throughout the whole system. Schedulers may purposely include slight delays in scheduling programs to accommodate these slight potential delays at the cost of less than optimal throughput. In short, synchronization between the two robots that must choose among several multi-accessible wafer locations, including the load cassettes, loadlocks, and process chambers, is key to maintaining acceptable throughput, but such synchronization is very complex.

Figure 5:
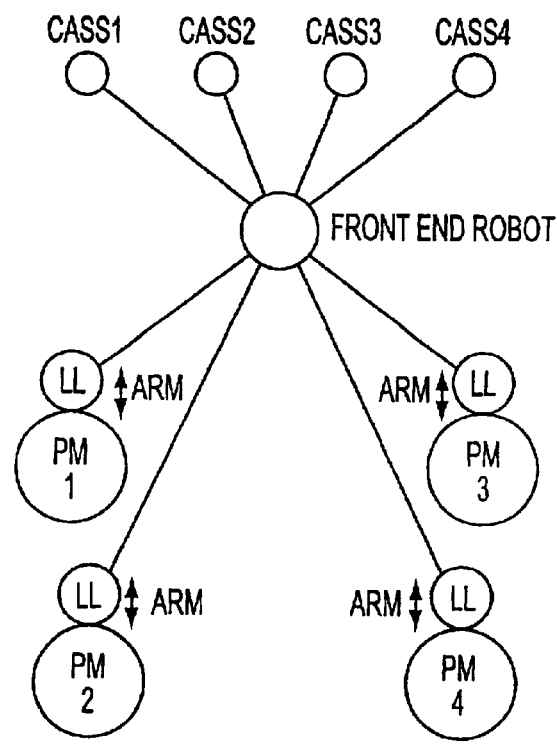
FIG. 5 is a diagrammatic illustration showing a wafer flow path diagram of the processing system shown in FIG. 1.

In contrast, the present invention employs one robot at the front end of the system to distribute substrates to one or more loadlock chambers, each dedicated to a respective process chamber. Each loadlock chamber includes a dedicated individual transfer arm for moving substrates between the dedicated loadlock chamber and the respective process chamber. FIG. 5 illustrates a flow path diagram corresponding to a processing system in accordance with the present invention. Because each process chamber now has a dedicated loadlock chamber and transfer arm rather than having to share loadlock chambers and a central robot as in the prior art, scheduling the flow of wafers is significantly less complex because possible number of wafer flow paths is significantly reduced from that of the prior art.

As shown in FIG. 5, a processing system in accordance with the present invention has an equal number of process chambers as that of the prior art shown in FIG. 4. However the present invention dedicates a loadlock chamber to each process chamber thus providing four loadlock-process chamber assemblies LL/PM1, LL/PM2, LL/PM3, and LL/PM4 and eliminating the need for a central hub robot. Thus, the number of possible wafer flow paths is reduced from the sixty-four (64) paths of the prior art to sixteen (16) paths of the present invention. For example, four possible "load cassette/front end robot" paths multiplied by four possible "front end robot/loadlock-process chamber assembly" paths equals sixteen (16) possible paths. Accordingly, scheduling of the present invention is less complex because there are far fewer path options to manage. The front end robot delivers wafers to one of four (in this example) loadlock chambers, and once placed in a loadlock chamber, a wafer's path into and out of a process chamber is fixed and independent of any other wafer's path.

In accordance with the present invention, the lengthy process of loadlock environmental changes and process chamber processing are contained in individual loadlock-process chamber assemblies, each including a loadlock chamber, a transfer arm, and a process chamber. The present invention allows parallel processing of substrates because it establishes parallel paths between the respective loadlocks and process chambers, as represented by arrows ARM in FIG. 5. The complexity in scheduling is thus reduced because the addition of dedicated loadlock chambers and transfer arms enables independent and parallel processing of the substrates.

Another important attribute of the present invention is the addition of dedicated hardware for each loadlock-process chamber assembly that is sufficiently simple in design to be cost effective despite its duplicity. Because each process chamber has its own loadlock chamber, a wafer transfer plane within each loadlock-process chamber assembly is established that is simple and relatively constant. Hence, a transfer arm having a single translation axis can be employed to transfer a wafer between each loadlock chamber and a respective process chamber. Further, overall tool footprint can be reduced when a front end robot has a vertical span capable of reaching the transfer planes of multiple stacked loadlock-process chamber assemblies. Thus, the present invention preferably includes or is used in conjunction with a single front-end robot having multi-axis capability including an appropriate vertical span and with multiple low-cost single axis transfer arms.

Figure 6:
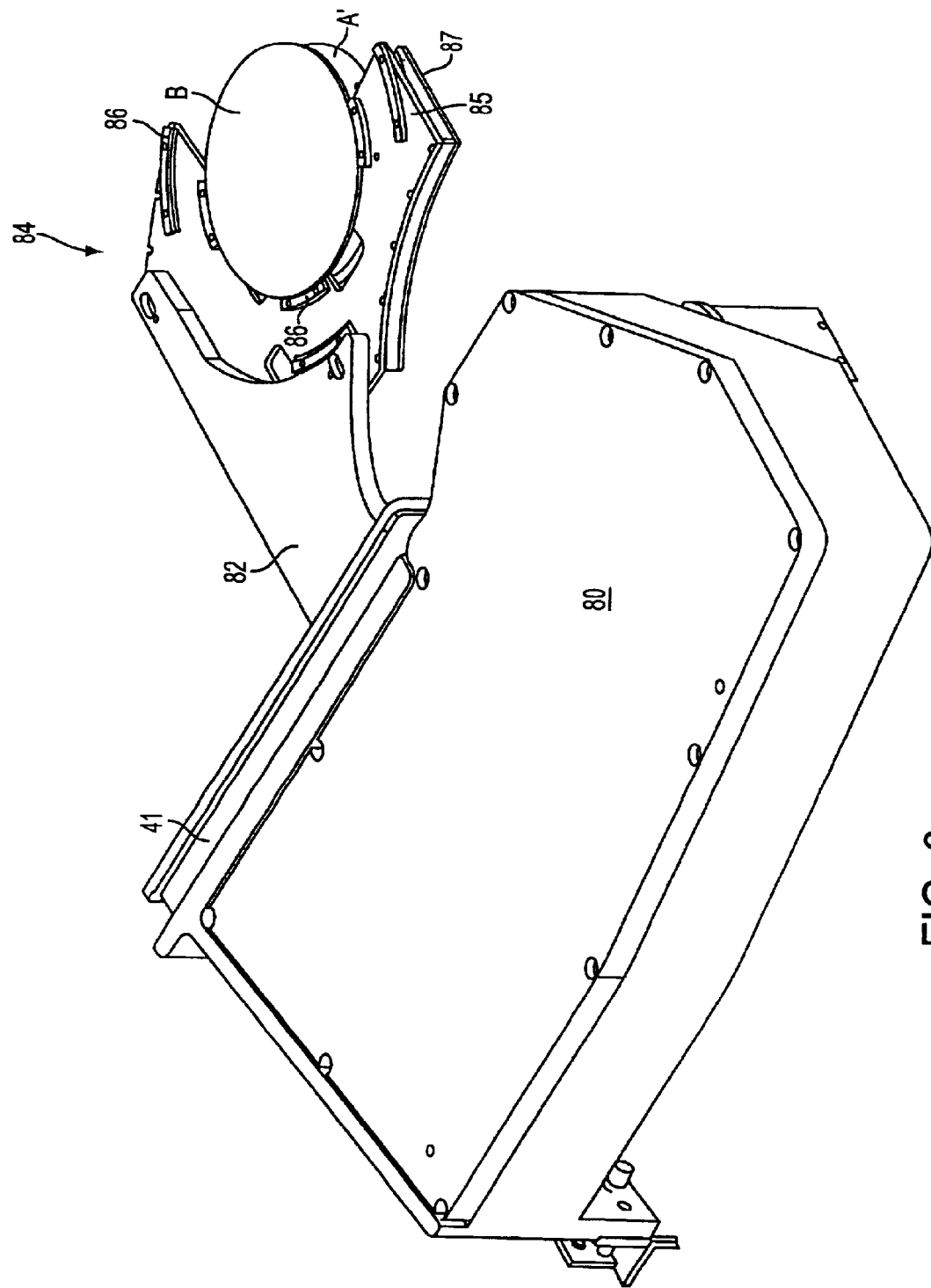
FIG. 6 is a perspective view of a loadlock chamber and a transfer arm in an extended position holding two wafers.
Figure 7:
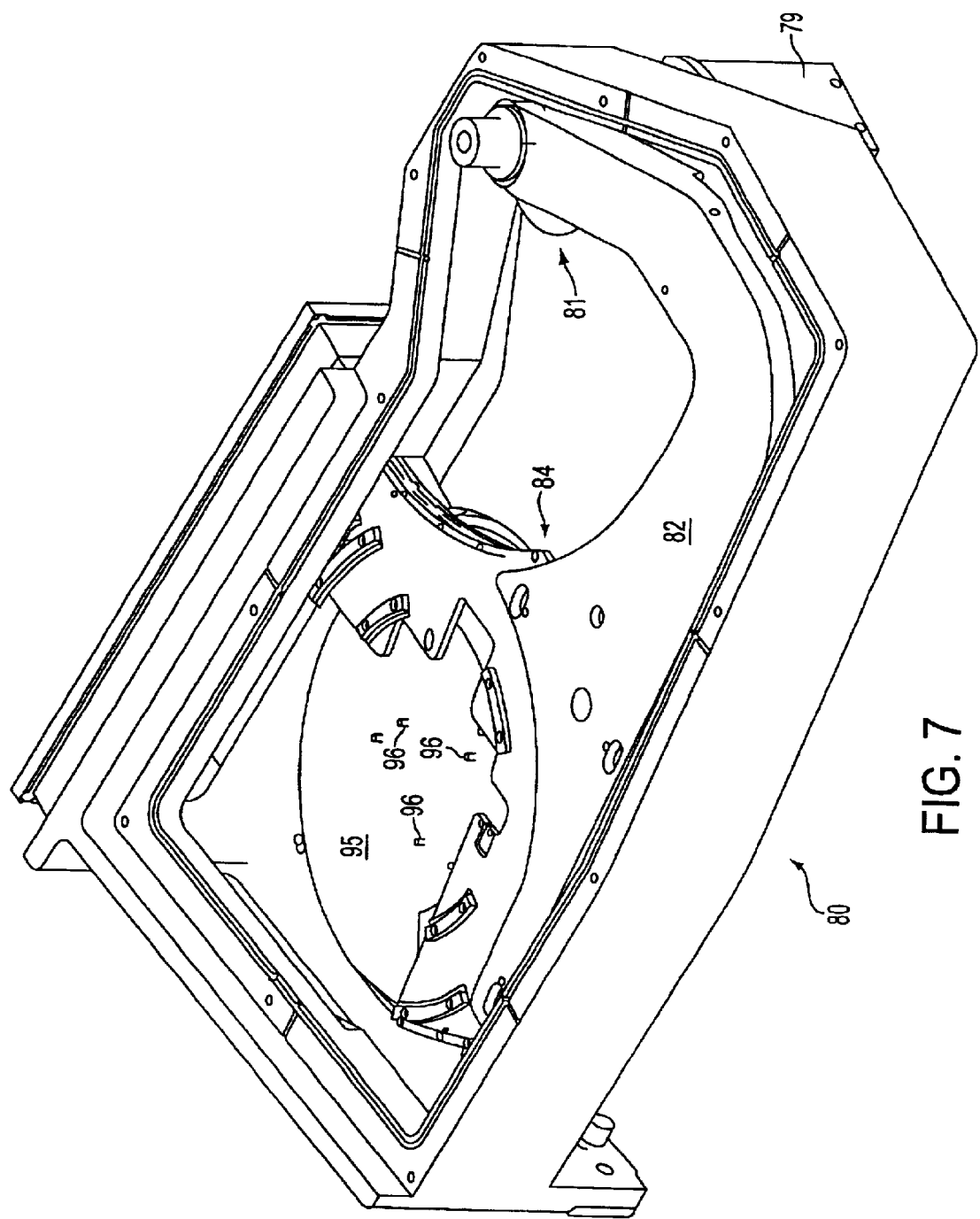
FIG. 7 is a perspective view of the loadlock chamber shown in FIG. 6 with the cover removed to show the transfer arm in a retracted home position.
Figure 8:
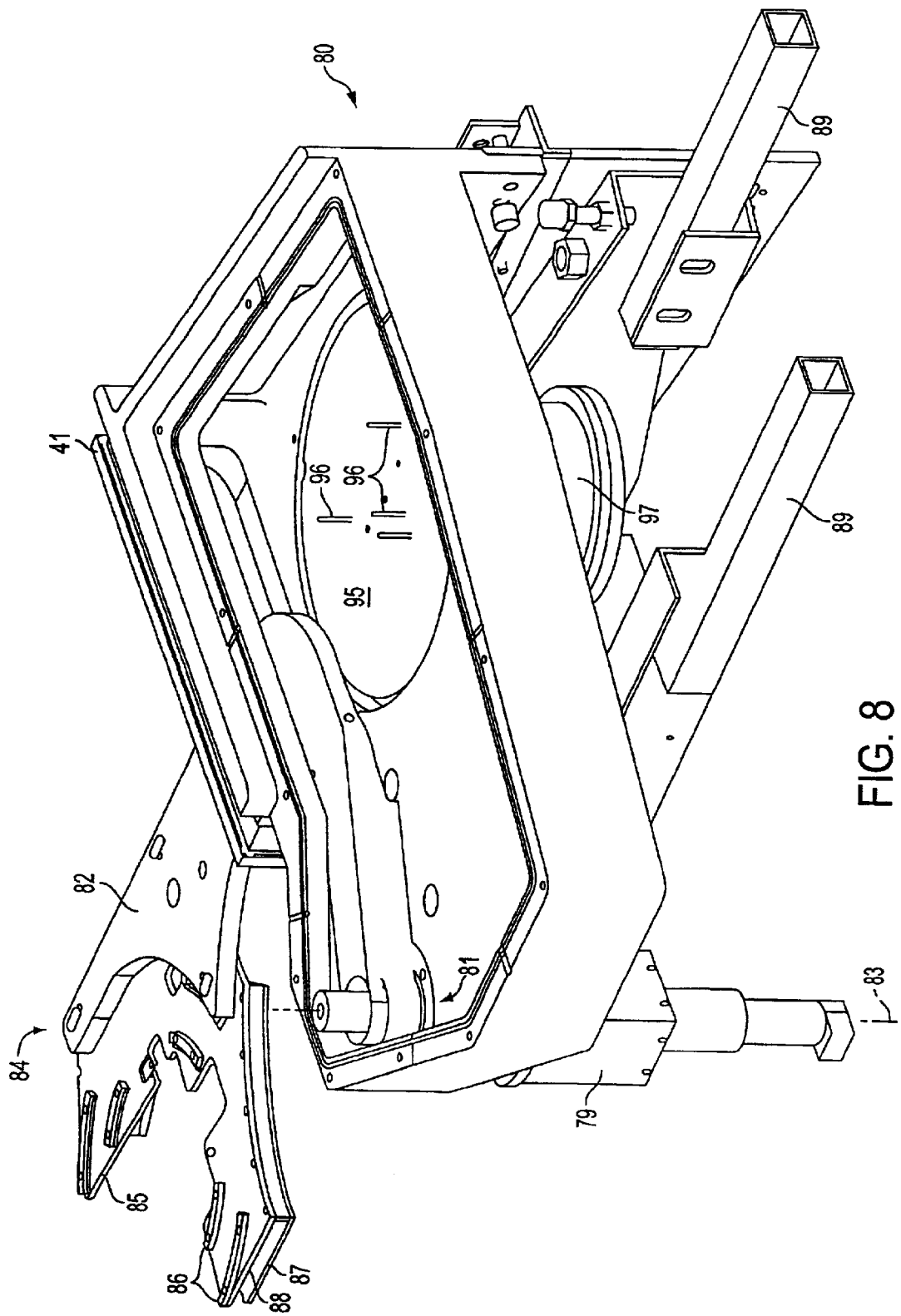
FIG. 8 is a perspective view of the load lock chamber similar to FIG. 6 including a support structure but without wafers.

One aspect of the present invention which allows dedication of one loadlock chamber 80 to each process chamber 40 is the provision of a cooling plate 95, FIG. 7, within each loadlock chamber 80. Another aspect of the present invention which allows such dedication is the provision of a dual-wafer single-arm loadlock transfer arm 82, FIG. 6, which has the capability to transport two wafers simultaneously, including one unprocessed wafer and one processed wafer. Significant cost improvement is obtained with the configuration of the present invention because only one translation axis is controlled through the control system for each process chamber. As shown in FIGS. 7 and 8, transfer arm 82 only rotates about transfer arm pivot axis 83, thus only a single uncomplicated angular motion of transfer arm 82 about pivot axis 83 need be controlled by the control system.

Referring to FIGS. 7 and 8, a wafer cooling plate 95 is mounted inside loadlock chamber 80. A monolithic single-axis loadlock transfer arm 82 (theta-axis rotation) with a dual-wafer effector end 84 is also provided which allows vertical coaxial placement of two wafers on end effector 84. Transfer arm 82 has a single servo axis or pivot axis 83 and is operated by a single servo mechanism such as transfer arm drive motor assembly 79. End effector 84 is a U-shaped component allowing an unprocessed wafer to be placed on an upper wafer shelf 85 of end effector 84 and a another processed wafer placed on lower wafer shelf 87. The shelves are defined by horizontal plates forming shelves 85, 87 and include supporting wafer edge supports 86, 88 on the open portion of end effector 84.

Transfer arm 82 has a home position, as shown in FIG. 7, in which transfer arm 82 is located entirely within loadlock chamber 80 awaiting delivery of an unprocessed wafer from front end robot 8, or awaiting removal of a processed wafer by cooling plate lift pins 96, as discussed below. Wafer cooling plate 95 is integrated into loadlock chamber 80 for cooling processed wafers before they are removed from loadlock chamber 80 by AFE robot 8 to minimize wafer transfer failures resulting from thermally-warped wafers and cassette material failures from high-temperature post-processed wafers. Cooling plate 95 is mounted below transfer arm 82 and is concentrically oriented with respect to wafers mounted on the upper and lower wafer shelves 85, 87. Cooling plate 95 may be liquid cooled or air cooled or inert gas cooled to ambient temperatures. For example, water at about 18° C. to 25° C. may be circulated through cooling plate 95 to regulate the temperature thereof. One should appreciate that other suitable liquid temperature ranges maybe used. In the case that cooling plate 95 is liquid cooled, the cooling liquid may be circulated through cooling plate 95, chuck assembly 60, and the walls of process chamber 40 for temperature regulation thereof.

Cooling plate 95 is equipped with cooling plate lift pins 96 which may elevate wafers resting on lower wafer shelf 87 when loadlock transfer arm 82 is located in the home position. The height of cooling plate lift pins 96 is controlled by a cooling plate lift pin actuator 97, shown in FIG. 8. Once a wafer is elevated, loadlock transfer arm 82 pivots away from the home position to an extended position, shown in FIGS. 6 and 8, leaving the wafer behind on cooling plate lift pins 96. The wafer is then lowered to the cooling plate in order to cool the disc. Alternatively, the wafer may be lowered to a position slightly above cooling plate 95 such that the wafer is cooled without contacting plate 95 thus minimizing wear and thermal stress on the wafer. One should appreciate that various types of cooling may be implemented including conductive, convective, or radiative cooling.

In a similar fashion, cooling plate lift pins 95 extend to elevate a wafer above the level of upper water shelf 85 and then lower to load the wafer on shelf 85 once transfer arm 85 returns to its home position. As noted above, cooling plate lift pin actuator 97 controls lift pins 96. Cooling pin actuator 97 is located external to loadlock chamber 80 to minimize the dimensions of loadlock chamber 80. For example, a linear solenoid or other known linear actuators may be mounted external to loadlock chamber 80. A bellows (not shown) is used to interconnect the actuator and cooling pins 96 in a manner to preserve the evacuated environment of loadlock chamber 80. Alternatively, one should appreciate that a cooling pin actuator could be instead located within the loadlock chamber if so desired.

Figure 9:
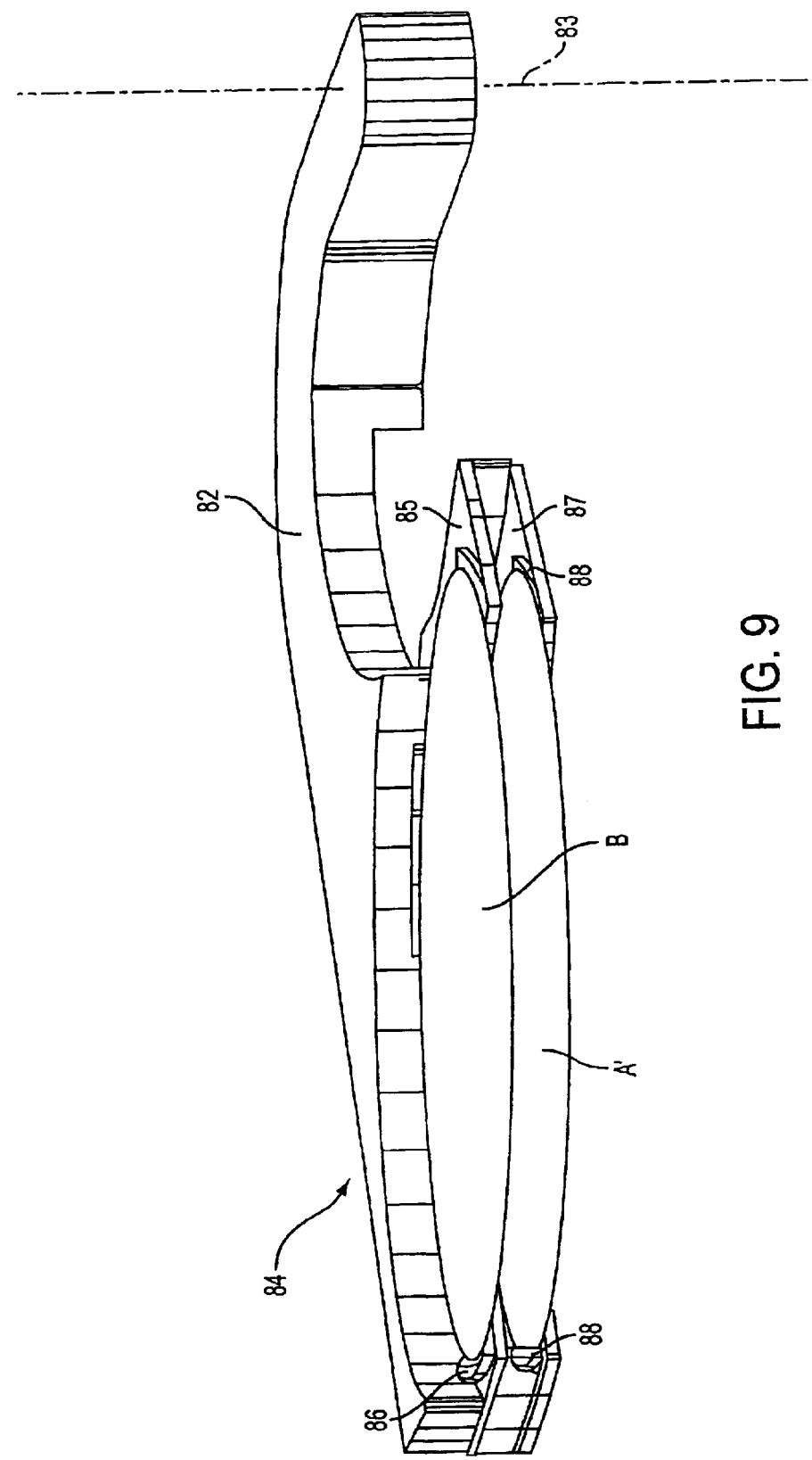
FIG. 9 shows a perspective view of transfer arm similar to the one shown in FIG. 6 carrying two wafers.

Regarding the shape of wafer shelves 85, 87, it is noted that upper wafer shelf 86 is substantially U-shaped thus allowing transfer arm 82 to retract from its extended position while an unprocessed wafer is supported by extended chuck lift pins 70 in the up position, as discussed in detail below. In particular, the U-shape of upper wafer shelf 85 prevents lift pins 70 from contacting upper shelf 85 or the transfer arm 82. In contrast, lower wafer shelf 87 only supports a wafer on opposing sides of the wafer by lower wafer supports 88, as shown in FIGS. 9 and 12. As shown in FIG. 12, the base of the U-shape of lower wafer shelf 87 is open thereby allowing transfer arm 82 to extend from its retracted/home position while a processed wafer is supported by extended cooling plate lift pins 96 in their up position.

Figure 10:
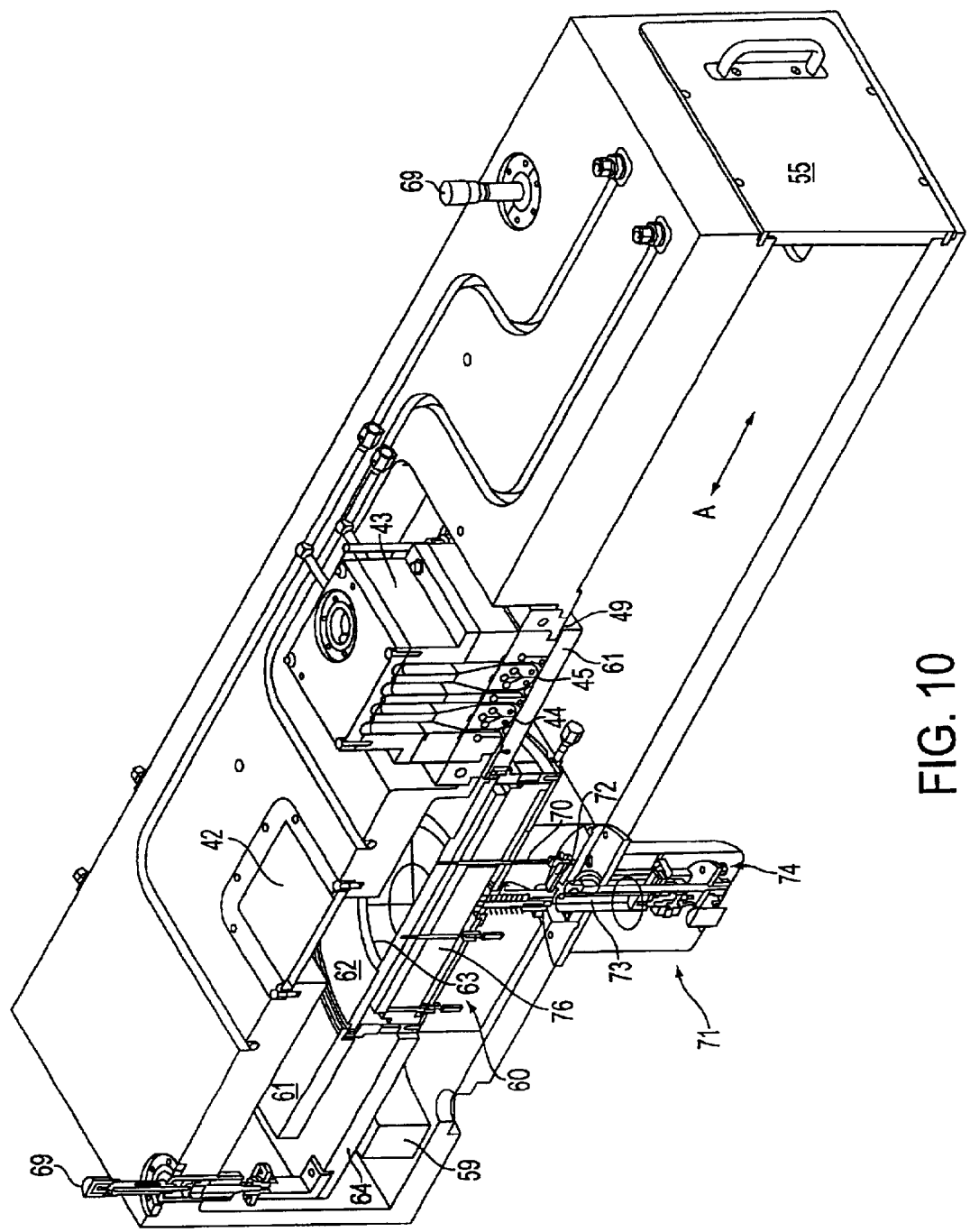
FIG. 10 is a perspective sectional view of the process chamber of FIG. 2 taken along line 10—10 of FIG. 2.

Referring now to FIG. 10, an exemplary process chamber 40 is shown. In this embodiment, process chambers 40 may incorporate a chemical vapor deposition (CVD) linear injector 43 assembly such as, for example, a MultiBlok™ linear injector of the type made by the Silicon Valley Group Thermal Systems, Scotts Valley, Calif. and further described in U.S. patent application Ser. No. 09/113,823 (Attorney Docket No. A-59471-4), filed Jul. 10, 1998, the entire disclosure of which is incorporated herein by reference. Each CVD linear injector assembly 43 employs linear injectors 44, 45 for processing 200 mm wafers. Alternatively, three linear injectors may be employed in a single CVD linear injector assembly for processing 300 mm wafers. However, one should appreciate that other types of process chambers could also be utilized in accordance with the present invention. For example, a process chamber in which films are grown and annealed at elevated temperatures could also be used either in combination with or instead of the CVD chambers discussed above.

A semiconductor wafer chuck assembly 60 is provided inside each process chamber 40. Wafer chuck assembly 60 has several basic functions including: (1) receiving a wafer from and releasing a wafer to the transfer arm; (2) holding a wafer during processing; (3) providing a uniform thermal environment for a wafer depending upon wafer process temperatures; and (4) translating a wafer within the process chamber if required by the wafer process method. For example, wafer chuck assembly 60 may be provided inside each process chamber 40 for preheating, securing, and transporting the wafers relative to CVD linear injector assembly 43. Alternatively, chuck assembly 60 may also be used to cool a wafer and/or translate the wafer relative to other types of processing tools, such as material removal tools.

As shown in FIG. 10, wafer chuck 60 includes a clamping surface 62 on which a semiconductor wafer is placed. Wafer chuck 60 includes a heating element (not shown) which preheats the unprocessed wafer prior to processing by CVD injector 43. Chuck insulation 76 is also provided to isolate the heat applied to the wafer. A hold down clamp such as a chuck vacuum clamp 63 secures the wafer to chuck assembly 60. Such vacuum clamps are well known in the art and are not discussed in detail. One should appreciate that other suitable clamping means may also be used such as electrostatic wafer clamping means. Generally, a backside of a wafer is vacuum held against a wafer chuck plate 62 of wafer chuck assembly 60 by a chuck vacuum clamp 63 in a known manner. The vacuum clamp is operably connected to a vacuum source by a chuck assembly umbilical chain 59. Umbilical chain 59 provides power, control signals, and cooling water to chuck assembly 60 while allowing it to translate within process chamber 40.

Injector gases are contained within deposition micro-zones or micro-regions, indicated generally by the numeral 49, which is defined as the area immediately under the linear injector outlets. The top surface of a wafer mounted on wafer chuck plate is substantially coplanar with a top surface of seal plates 61, both of which are adjusted to pass within approximately 1 mm of the bottom outlets of linear injectors 44, 45. Such placement of the wafer defines a low-conductance gas path between deposition micro-zones 49 and remainder of process chamber 40. This path is referred to as a micro chamber isolation region or the semi-seal region. The 1 mm semi-seal gap is adjusted by adjusting the position of a chuck translation frame 64 with respect to injector assembly 43, as discussed below. Once the semi-seal gap is set, it does not change during system operation.

Figure 11:
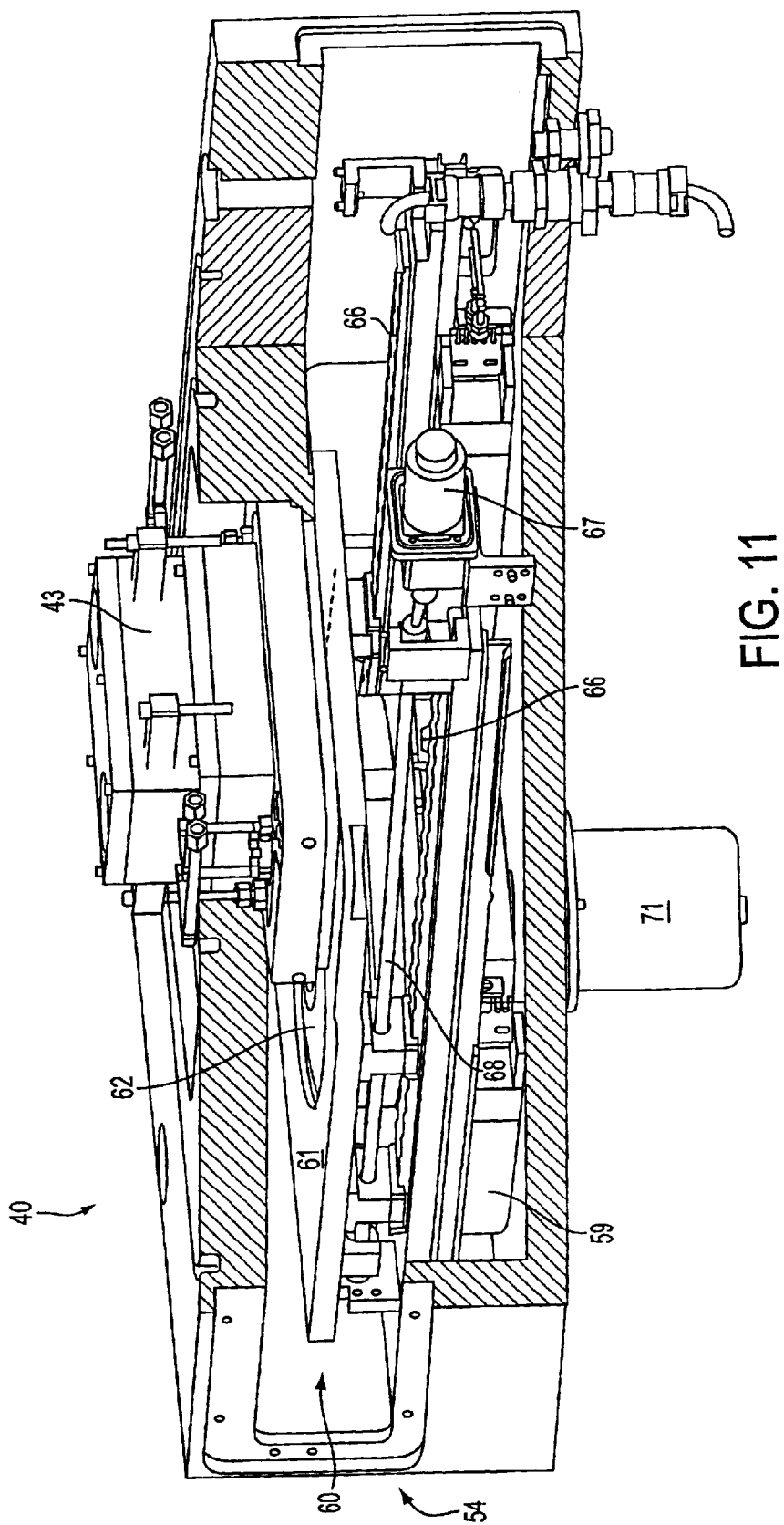
FIG. 11 is a perspective sectional view of the process chamber of FIG. 2 taken along line 11—11 of FIG. 2.

In practice, a wafer is placed on chuck surface 62 while the chuck is in a retracted or load position, as shown in FIGS. 10–12. The wafer is positioned over chuck lift pins 70 which lift the wafer from upper wafer shelf 85. Transfer arm 82 pivots back to its home position leaving the wafer on chuck lift pins 70. Next, the wafer is lowered to the chuck surface 62. Chuck lift pins 70 raise and lower in unison and are operably connected to a chuck lift pin yoke 72. Lift pin yoke 72 is, in turn, operably connected to a chuck lift pin linear drive shaft 73 which is actuated by a lift pin servo actuator assembly 74. It should be appreciated that other means for controlled linear movement may also be used. For example, a worm drive could be provided to impart linear motion on chuck lift pin yoke 72 and/or chuck lift pins 70.

Referring to FIG. 11, the wafer is vacuum-clamped to chuck surface 62. Chuck assembly 60 translates along chuck guide rails 66 of chuck translation frame 64, past CVD injector 43, to an extended position. For example, a chuck translation actuator 67, such as an electric servo motor, operably drives chuck assembly 60 along chuck guide rails 66 via a chuck translation driving screw 68. One skilled in the art would recognize that other chuck translation devices may also be used. Thus, the wafer secured to wafer chuck plate 62 is translated under the injector outlets of the linear injectors 44, 45 in a single full-pass stroke in the direction of arrow A. The single full-pass stroke allows the entire wafer surface to be deposited by all the injector outlets (i.e., two injector outlets for a 200 mm wafer size, or by three injector outlets for a 300 mm wafer size.) It is noted that the number of injectors and/or injector outlets is not dependent on wafer size. The number of injectors and/or injector outlets can be varied in order to optimize throughput of process chamber 40. This full-stroke action may be repeated as many times as necessary to produce the desired processing of the wafer. The chuck translation speed may also be adjusted according to the desired thickness of a $SiO_2$ layer formed on the wafer as it passes CVD injector 43. For example, in one embodiment of the present invention, the translation speed ranges from about 1 mm/s to about 60 mm/s. Upon completing deposition, the wafer is translated back to the load position where chuck lift pins 70 raise the wafer off wafer chuck plate 62 in preparation for hand off to the loadlock transfer arm 82.

The process or reactor chamber 40 employs side doors 54, FIGS. 11 and 12, and end doors 55, FIG. 10, to allow easy access for servicing and calibration of the translation frame 64 and chuck assembly 60 without disturbing the semi-seal gap or deposition micro-zone, or any other process chamber components, such as CVD linear injector 43. As noted above, the 1 mm semi-seal gap is adjusted by adjusting the position of the chuck translation frame 64. This is accomplished by adjusting chuck adjusters 69. As shown in FIG. 2, each process chamber 40 is preferably provided with three chuck adjusters 69, two of which are also shown in FIG. 10. Such a configuration allows the pitch, roll, and height of chuck assembly 60 to be precisely adjusted. For example, chuck adjusters 69 could be adjusted to precisely adjust the semi-seal gap in the case that process chamber 40 includes a CVD linear injector 43. Chuck assembly adjustors 69 could also be used to adjust the position of a wafer relative to other processing tools. Such adjusters may take the form of adjusting screws or other well known adjusting means. One should appreciate that greater than or fewer than three chuck assembly adjusters may also be used. For example, two adjusters may be used in which a third point of translation frame 64 is fixed relative to process chamber 40.

Referring to FIG. 2, process chambers 40 are vertically arranged in pairs to conserve tool floor area or footprint requirements. The vertically stacked process chamber pairs in combination with a common chemical delivery system 24, and a common control system 21 are collectively referred to as a multi-chamber module (MCM) 20. The two process chambers could be substantially identical, for example, each could contain independent CVD linear injectors, wafer chuck assemblies, and chuck translation frames. Furthermore, each process chamber includes a respective dedicated loadlock chamber and cooling plate. In the event that changes are desired between the two chambers, such differences can be easily accommodated without affecting the other.

Figure 15:
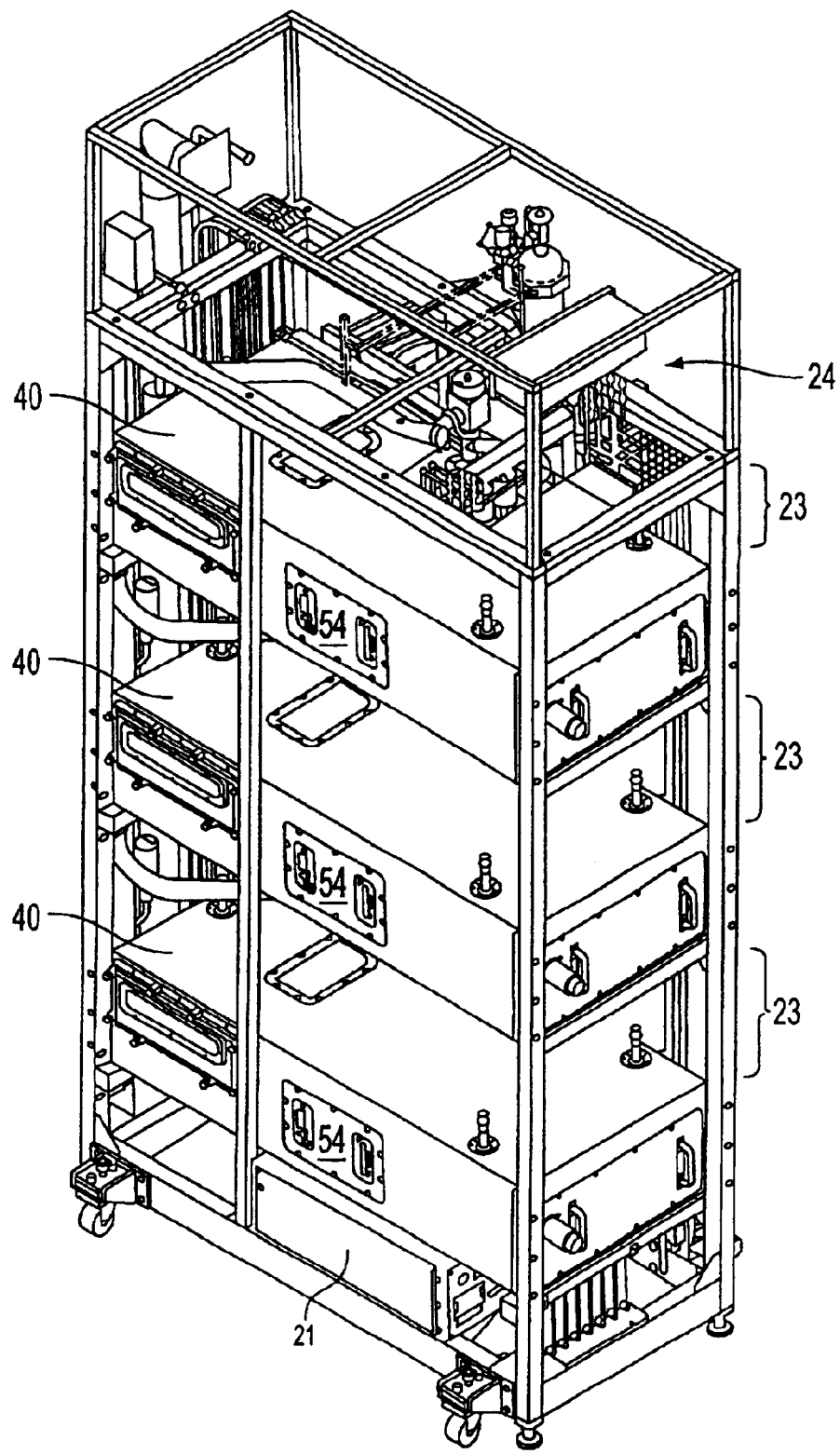
FIG. 15 is a perspective view of an alternative embodiment of the processing system according to the present invention.
Figure 17:
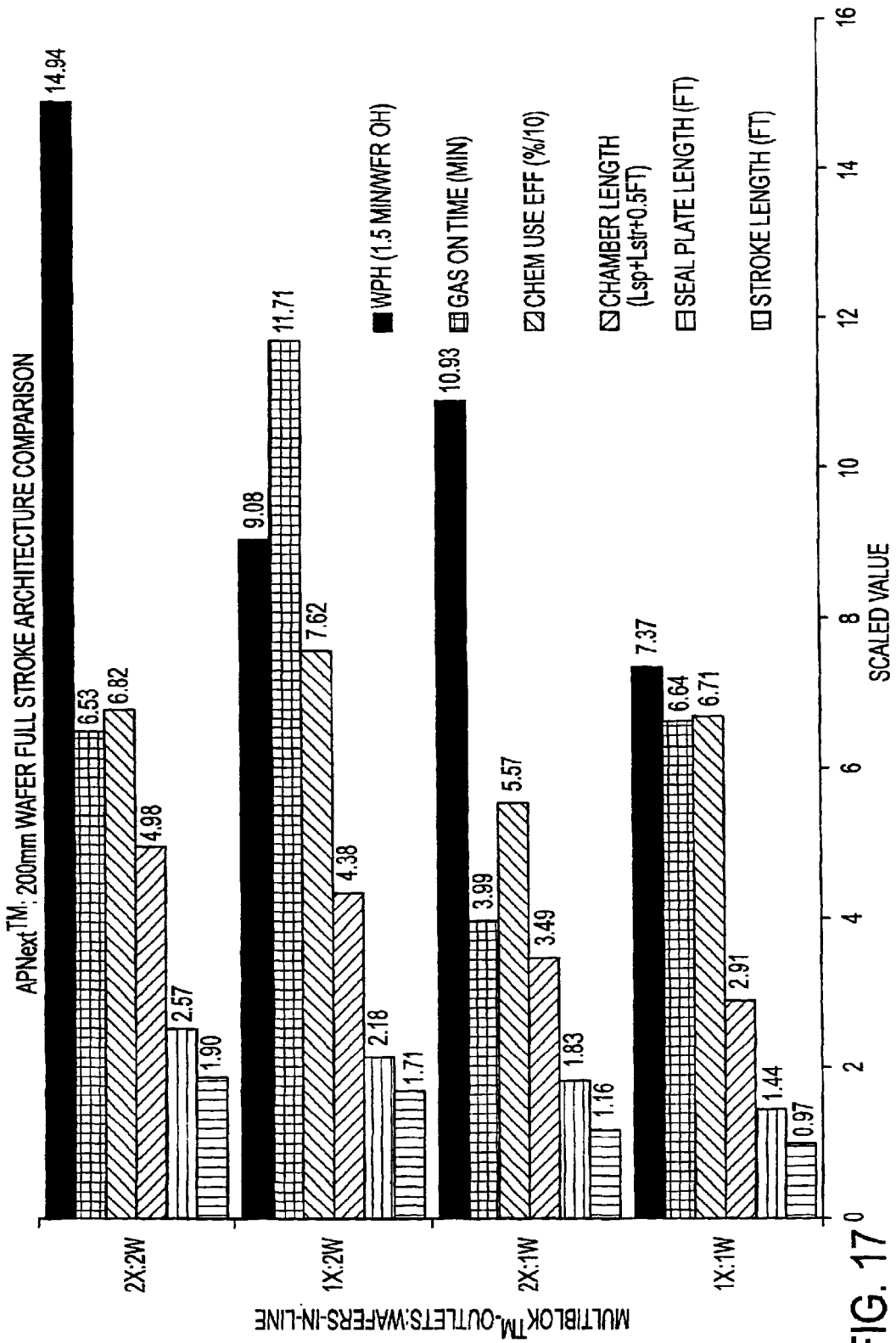
FIG. 17 is a diagrammatic illustration showing comparative analytical calculations for an exemplary 200 mm wafer full-stroke architecture for several parameters in accordance with the present invention.

Alternatively, different types of process chambers could be included in each multi-chamber module. For example, one process chamber 40 could include a CVD linear injector 43, while another process chamber, vertically stacked with respect to the first, could include a rapid thermal oxidation tool (not shown). Furthermore, one should appreciate that MCM 20 may include three process chambers 40 vertically stacked one above the other, as shown in FIG. 15. Again, one should appreciate that process chambers 40 may take the form of a CVD process chamber, as discussed above, or other types of process chambers, or a combination thereof.

The spacing between process chambers 40 of MCM 20 depends on specific design constraints such as maximum front end robot vertical stroke, service access spacing 23 between the process chambers for the CVD injectors and chemical delivery plumbing, as well as the overall height of the process chamber as defined by the maximum height of the chuck assembly and the translation frame. As shown in FIG. 12, chuck lift pin actuator 71 of the present invention is located external to process chamber 40 in order to reduce the overall height and volume of process chamber 40. Bellows 75 are used between lift pin actuator 71 and chuck lift pins 70 in order to maintain the particle-free, near-atmospheric-pressure environment of process chamber 40.

Vertically stacked process chambers 40 of MCM 20 are located on a common frame which also supports a common process chemical system 24 and a common local controls system 21. Delivery system 24 is located at the top of MCM 20 and provides and delivers material to the stacked process chambers 40. For example, delivery system 24 could include a chemical delivery system for delivering chemicals to the two stacked process chambers 40 within MCM 20. Common control system 21 may be located within the MCM, below the lower process chamber 40. Alternatively, such components could be provided on a separate rack alongside the CVD processing system, depending on the quantity and packaging requirements of the electronic components and any distance limitations in achieving reasonable process and system control. With one delivery system supplying all process chambers 40 of each MCM 20, significant cost and space savings can be achieved. One should recognize that the actual location of process chemical delivery system 24 and common control system 21 may vary within the scope of the present invention. For example, delivery system 24 could be located below the lower process chamber or between process chambers. Likewise, common control system 21 could be located above upper process chamber.

Figure 13:
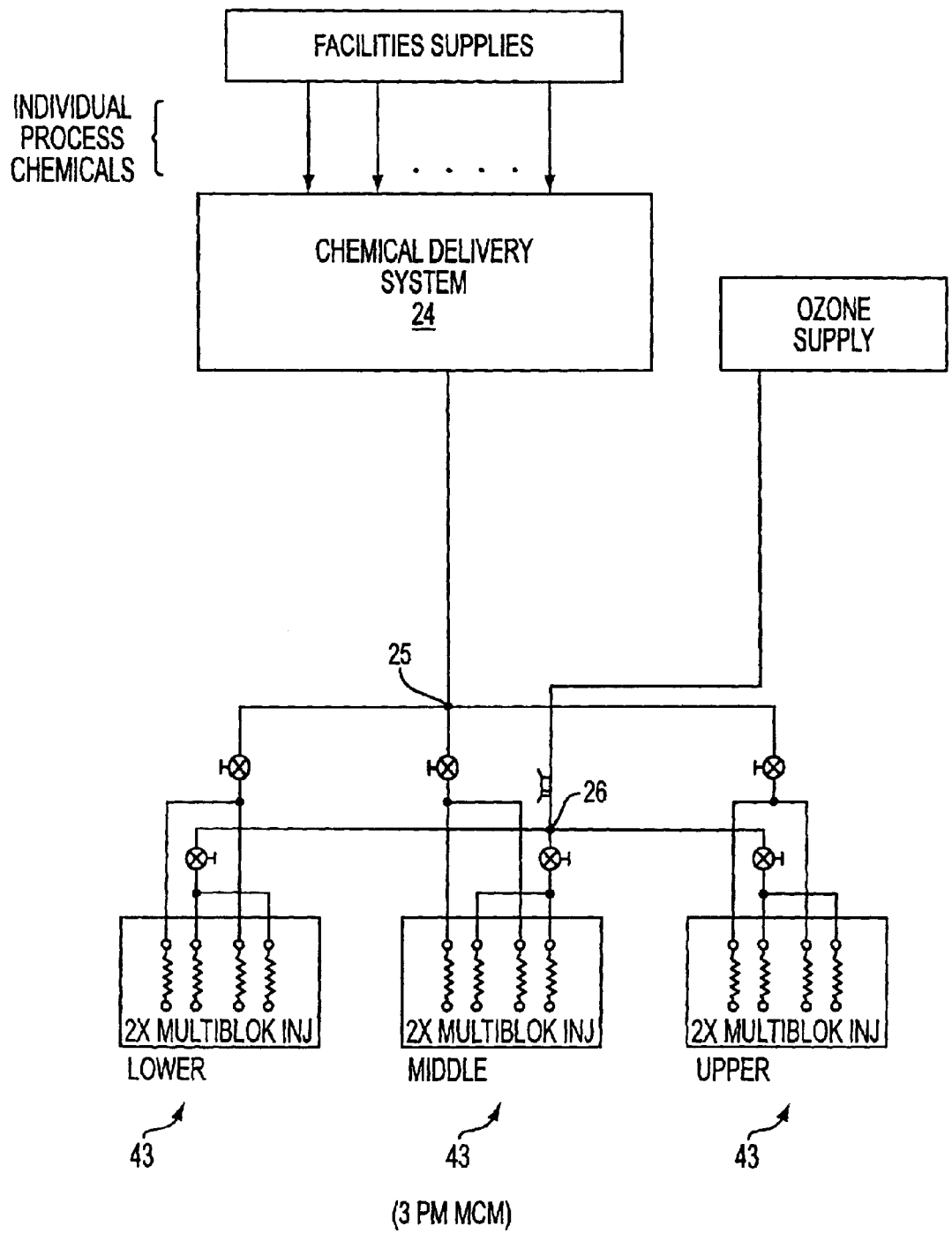
FIG. 13 is a diagrammatic illustration showing an exemplary common chemical delivery system.

An exemplary process chemical delivery system 24 for three stacked process chambers is shown in FIG. 13. Delivery system 24 includes a chemical delivery system having a manifold unit 25 for splitting the chemical sources into the CVD linear injector 43 of three process chambers 40. Alternatively, a manifold unit may be provided to split the chemical sources into the injectors of fewer than or greater than three process chambers. As such, chemical deposition simultaneously starts and stops in all process chambers 40 of a MCM 20. There is no individual means of metering, controlling, or balancing chemical delivery between the individual process chambers 40 for wafer processing operations. Instead, a source-chemical split point 25 and an oxidizer split point 26 substantially uniformly distribute the chemical sources and the ozone, respectively, into the individual CVD linear injectors 43. Any slight variations in deposition thickness resulting from chemical delivery variations between the process chambers 40 are accommodated by varying the wafer chuck translation speed thereof, since each process chamber 40, has independent chuck translation actuators 67. Individual metering-valves or flow-controllers for each chamber may be provided to individually control chemical source and ozone delivery into individual process chambers 43. Thus, allowing each process chamber 43 to operate independently of the others. The common delivery system of the present invention minimizes overall cost and complexity of the wafer processing system. One should appreciate that individual delivery systems, for example individual flow control valves, may instead be utilized for each process chamber but such configuration may result in higher costs.

One ozone generator is provided for each delivery system 24 of a respective MCM 20. However, one liquid chemical supply cabinet may be provided for multiple delivery systems 24 corresponding to multiple MCMs 20. A similar approach is employed for anhydrous HF cleaning systems, when utilized, where one HF system is employed and passively split by a manifold unit between all process chambers 40 of one MCM 20. However, in a variant to the design, if an atomic fluorine generation source is used to generate cleaning precursors, then one fluorine generation source is provided for each process chamber 40, although the cleaning of all process chambers 40 in one MCM 20 will take place simultaneously to optimize throughput of process chambers 40 and to simplify the chemical delivery hardware for the fluorine generation source. Alternatively, other embodiments could include a single atomic fluorine source for both process chambers in one MCM.

Figure 14:
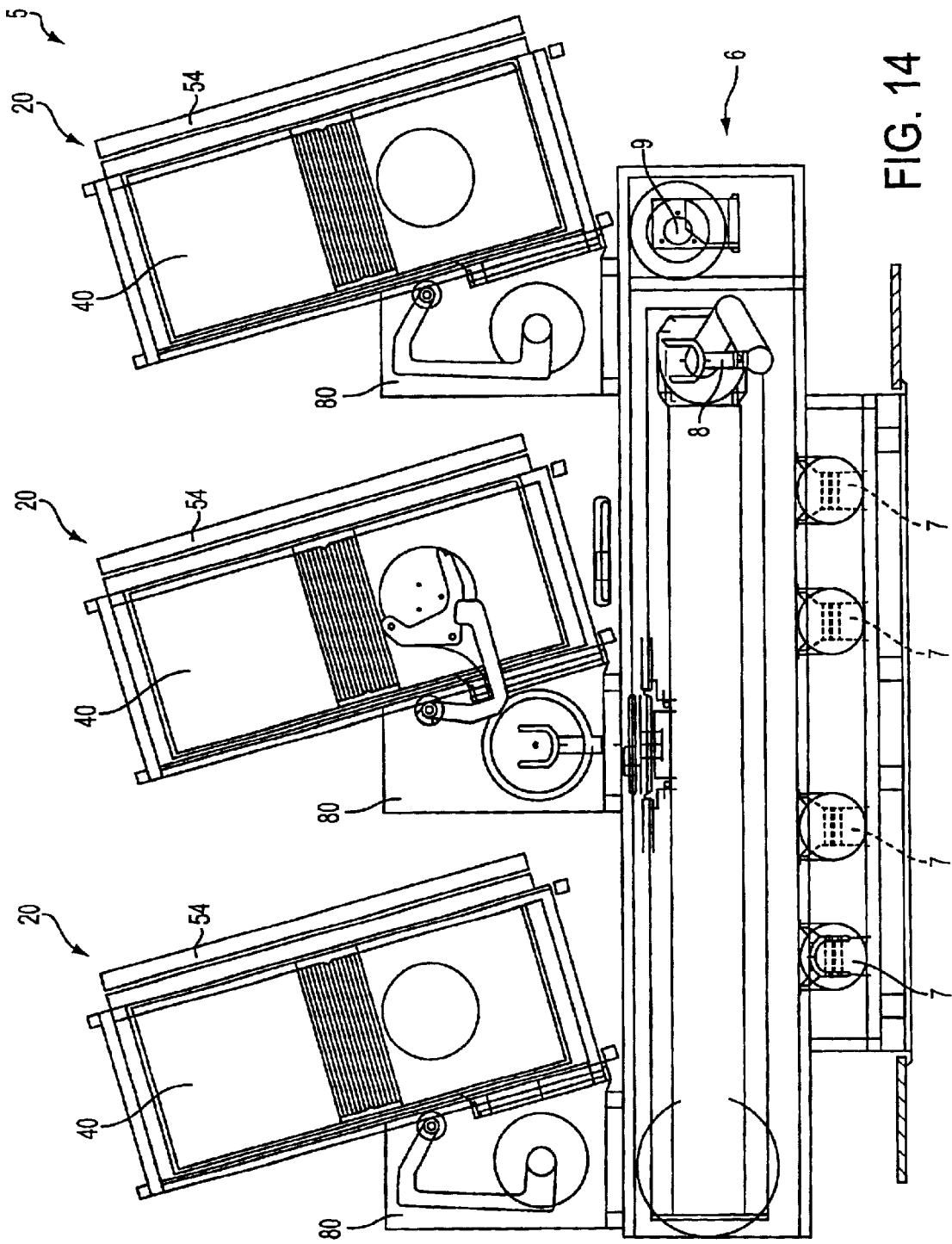
FIG. 14 is a plan view of an alternative embodiment of the processing system according to the present invention.

The plan view of the wafer processing system 5 of the present invention is arranged such that a series of MCMs 20, e.g., two, three, or more MCMs 20, are arranged in a linear fashion in parallel to each other. Such arrangement of MCMs 20 may be perpendicular to AFE unit 6, as shown in FIG. 3, or an angle, as shown in FIG. 14, according to the specific design of loadlock chambers 80. As such, wafer processing system 5 may be considered a "linear array".

One skilled in the art would recognize that several MCMs may be employed using other geometries around a transport system, such as a circular arrangement around a central robot, a mirrored parallel arrangement surrounding a translating central robot on the left and right sides of the machine, or other non-linear arrangements where the stacked chambers may be employed, provided that a loadlock chamber is provided for each process chamber.

The configurations of process chambers 40 and MCMs 20 discussed above provide footprint improvements over similar linear injector cluster tool systems. For example, as compared to conventional systems having an equivalent number of process chambers, for example, having four process chambers, the footprint is reduced from about 168 square feet ($ft^2$) for a prior art system to about 73 square feet ($ft^2$) for a system according to the present invention. This reduction in footprint is accomplished primarily by stacking CVD process chambers 40, and eliminating a distinct transport module hub typically provided in conventional cluster tool CVD processing systems, in favor of individual loadlocks 80 attached to a corresponding CVD process chamber 40 and to the atmospheric-pressure front end unit 6. Also, space is more efficiently utilized in the linear array layout because space is not lost to a large transport module (TM) chamber and central hub robot typically present in conventional systems at the center of a cluster tool system (diagrammatically shown in FIG. 4).

Footprint areas of CVD processing system of 300 mm applications (e.g. wafers) according to the present invention are comparable to the footprint areas of conventional systems for 200 mm applications. The present invention provides tremendous advantages for wafer processing facilities originally designed for 200 mm applications because such facilities may incorporate the inventive system for 300 mm applications using the existing floor space of the facility.

The semiconductor wafer processing system, semiconductor wafer transfer apparatus, and method of the present invention provide numerous technical benefits. For example, production and processing costs, as well as the complexity of the system may be minimized by eliminating the need for multiple servo axes to move the wafer. The motion of the semiconductor processing apparatus, for example transfer arm 82, is reduced to a motion about a single axis, thereby reducing overall wafer automation costs. Use of the monolithic single-axis transfer arm also eliminates articulated components in the transfer mechanism thus minimizing complexity and potential reliability failures. The single-axis transfer arm of the present invention further minimizes particle formation and contamination because there are fewer moving parts in the loadlock chambers. The single axis-arm minimizes the depth of the overall system by allowing side-loading of the process chambers and thus optimizes packaging constraints of the system. Furthermore, by placing a cooling plate in each loadlock chamber, there is no need for a dedicated separate cooling station. The cooling plate arrangement of the present invention does not require additional transfer arm axes since it employs cooling plate lift pins for wafer removal of wafers from the transfer arm. This represents an advantage over prior art wafer cooling and transfer approaches in that both these functions are housed in a single space-saving unit.

In one embodiment of the present invention, the process sequence of the process chamber involves a full-pass deposition strategy in which the sensitivity of film thickness or dopant concentrations to chemical turn-on and stabilization is minimized. Alternatively, the process sequence of the process chamber may involve active cyclic translation as is described in U.S. Pat. No. 09/113,730 (Attorney Docket No. A-66484), filed Jul. 10, 1998, the entire disclosure of which is incorporated herein by reference.

The combination of reduced footprint, reduced cost, with no degradation of overall system throughput results in lower cost of ownership and lower per wafer processing costs. For example, in one embodiment of the invention the expected cost of ownership of this tool for a 5000 angstrom BPSG film is between about $2.65–$2.72 per wafer, depending on the number of process chambers in the system (i.e., six (6) process chambers vs. four (4) process chambers). By comparison, the deposition of an identical film by a prior art system has cost of ownership values in the $3.59–$4.95 range, depending on the particular manufacturer and model. This exemplary comparison represents a savings of between about twenty-six and forty-five percent per wafer.

EXEMPLARY OPERATION OF THE PREFERRED EMBODIMENT

Referring particularly to FIGS. 16(a)–(l), an exemplary method of semiconductor wafer transfer and processing in accordance with the present invention is schematically illustrated in which a loadlock chamber 80 is attached to a respective process chamber 40. A loadlock transfer arm (not shown in FIG. 16) similar to transfer arm 83 receives semiconductor wafers from a front end robot 8 (not shown in FIG. 16) moves the wafers between the loadlock chamber and the process chamber.

Three tiers illustrated within loadlock chamber 80 represent wafer positions when resting on upper wafer shelf 85', lower wafer shelf 87', and cooling plate 95' within loadlock chamber 80. A fourth "pins up" wafer position slightly above the cooling plate is not shown, but is discussed below. Two tiers illustrated within process chamber 40 represent wafer positions when the wafer is resting on upper wafer shelf 85" and lower wafer shelf 87" within process chamber 40. Other wafer positions such as "chuck surface" and "preheat" wafer positions are not shown but are discussed below.

The exemplary method of semiconductor wafer transfer and process includes the following steps.

1. Wafer cassettes 7 are placed on their respective stands or automated load ports at the frontal plane of the atmospheric-pressure front end (AFE) unit 6.
2. Atmospheric-pressure front end robot 8 removes a first unprocessed wafer from wafer cassette 7 and transfers it to wafer aligner 9.
3. Wafer aligner rotates the first unprocessed wafer to calculate the wafer centroid and determine wafer offset. Also, wafer notch position is determined and oriented according to the specific process needs.
4. Robot 8 performs an offset pick step where the first unprocessed wafer is removed from aligner 9 with a calculated offset to perfectly center the first unprocessed wafer on effector end 84 of loadlock transfer arm 82.
5. Loadlock chamber 80 is vented to atmospheric-pressure and opened.
6. With transfer arm 82 in its home position, the first unprocessed wafer A is placed on upper wafer shelf 85 of transfer arm effector end 84 by the atmospheric-pressure front end robot 8, as shown in FIG. 16(*a*). Loadlock chamber 80 is then closed and evacuated to a transfer pressure substantially equal to the pressure within process chamber 40.
7. When evacuation is complete, process chamber slot valve 41 opens and loadlock transfer arm 82 rotates to transfer the first unprocessed wafer A into process chamber 40, as shown in FIG. 16(*b*). At this point, chuck lift pins 70 in chuck assembly 60 are in the "down" position, i.e., below chuck surface 62.
8. Loadlock transfer arm 82 precisely locates the first unprocessed wafer A concentric with the diameter of chuck assembly 60. Chuck lift pins 70 then rise, contact the first unprocessed wafer A on loadlock transfer arm 82, and raise the first unprocessed wafer A above loadlock transfer arm 82 to the unprocessed wafer "load" position to allow loadlock transfer arm 82 to retract back into loadlock chamber 80, leaving the first unprocessed wafer A on top of the chuck lift pins 70.
9. Chuck lift pins 80 retract to a "wafer preheat" position, defined as 0.25–0.75 mm above wafer chuck plate 62. Upon completion of a preheat time of 8–20 seconds, chuck lift pins 70 are dropped completely, and the first unprocessed wafer A is vacuum clamped onto the wafer chuck plate 62, as shown in FIG. 16(*c*).
10. An ozone generator discharge power is quickly ramped from zero output to the process set point output, typically defined as 120 g/m$^3$ @ 40 slm. The ozone flows through the injector onto the seal plate and out the exhaust during this 10–15 second stabilization period. Concurrently, the temperature of wafer A is stabilized while it is mounted on the chuck and liquid source chemicals, for example, TEOS, TEB, and TEPo, are switched on to flow through injector 43 and into the deposition micro-region 49 above seal plate 61.
11. After the ozone and thermal stabilization period is complete wafer translation starts and the first unprocessed wafer is moved under CVD injector 43. Deposition starts immediately when the ozone and liquid source chemical strike and react on the surface of the first heated unprocessed wafer A to form a layer of SiO$_2$ on the wafer, which defines the actual CVD process.
12. Translation actuator 67 moves chuck assembly 60 under injector 43 in a linear fashion and at a constant speed until the entire unprocessed wafer A is "stroked" by the deposition gases from the injector. Depending on thickness, composition, and other process needs, a film is deposited evenly and completely on the unprocessed wafer by the injector gases emanating from the injector outlets, whereby the first unprocessed wafer A is converted to a first processed wafer A'.
13. During the CVD process described in steps 10–12 above, loadlock transfer arm 82 returns to its home position in loadlock chamber 80. Process chamber slot valve 41 is closed and loadlock chamber 80 is vented to atmosphere and opened. A second unprocessed wafer B is placed on upper wafer shelf 85 of loadlock transfer arm effector end 84 by AFE robot 8, as shown in FIG. 16(*c*). Loadlock chamber 80 is then closed and evacuated to the transfer pressure. After completing pump-down evacuation, loadlock chamber 80 remains idle until the CVD process on the first unprocessed wafer described in steps 10–12 above is complete.
14. When the CVD process on the first wafer is complete, ozone discharge power is ramped down and the liquid source chemicals are either diverted from injector 43 or are turned off. After chuck assembly 60 is moved back to its load position and waits several seconds in its load position until the injector reaches zero chemical concentration, vacuum clamp 63 is released in preparation for removal of the first unprocessed wafer.
15. After unclamping the first processed wafer A', process chamber slot valve 41 is opened and chuck lift pins 70 raise the first processed wafer A' to a height slightly above, for example, approximately 0.75–1.5 mm above, lower wafer shelf 87 of loadlock transfer arm effector end 84. Note that this processed wafer "unload" position is above the "preheat" position of step 9 but below the unprocessed wafer "load" position of step 8.
16. Loadlock transfer arm 82, carrying the second unprocessed wafer B on upper wafer shelf 85 of effector end 84, rotates into process chamber 40 and locates itself concentric with the first processed wafer on chuck lift pins 70, as shown in FIG. 16(*d*). Chuck lift pins 70 then drop to the "down" position, allowing the first processed wafer A' to be placed on lower wafer shelf 87 of end effector 84. Loadlock transfer arm 82 now rotates back into loadlock chamber 80, carrying both the first processed wafer A' on lower wafer shelf 87 and the second unprocessed wafer B on upper wafer shelf 85, as shown in FIG. 16(*e*).
17. After loadlock transfer arm 82 is rotated into its home position, the first processed wafer A' on lower wafer shelf 87 is lifted above end effector 84 approximately 0.75–1.5 mm by cooling plate lift pins 96 located in wafer cooling plate 95, which is positioned directly below and concentric with end effector 84 when loadlock transfer arm 82 is in its home position, as shown in FIG. 16(*f*). Once the first processed wafer A' is raised by cooling plate lift pins 96, loadlock transfer arm 82 rotates back into process chamber 40 carrying the second unprocessed wafer B on upper wafer shelf 85 of end effector 84, as shown in FIG. 16(*g*). The second unprocessed wafer B is now loaded onto wafer chuck assembly 60 in the same manner as described in steps 8 and 9 above and shown in FIG. 16(*h*).

18. Concurrent with step 17, the first processed wafer A is lowered onto or slightly above cooling plate 95 to the "pins up" position of cooling plate lift pins 96 at a height slightly above, for example, approximately 0.25 mm above the surface of cooling plate 95, as shown in FIG. 16(*g*). Loadlock transfer arm 82 is now free to rotate back into its home position directly above the first processed wafer A' on cooling plate 95. Cooling plate 95, which may be liquid or air cooled to ambient temperatures, cools the processed wafer to less than 70° C. in approximately 60 seconds, during which time loadlock chamber 80 is vented to atmosphere.

19. When the loadlock venting of step 18 is complete, front end gate valve 10 opens and cooling plate lift pins 96 raise the first processed wafer A" to an intermediate height, one which is between the cooling height and end effector 84 unloading height, as shown in FIG. 16(*h*). The AFE robot 8 retrieves the first processed wafer A" from cooling plate lift pins 96 and places the first processed wafer A" back into wafer cassette 7, as shown in FIG. 16(*i*).

20. With the front end gate valve 10 opened and loadlock chamber 80 at atmosphere, a third unprocessed wafer C is loaded into the loadlock chamber, as shown in FIG. 16(*h*) and as described in step 13, and the subsequent steps are repeated, as shown in FIGS. 16(*j*)–(*l*).

The method and apparatus of the present invention increases throughput of the process chambers and of the entire processing system by a parallel processing architecture in which each process chamber has its own dedicated loadlock chamber and dedicated wafer transfer arm, and is serviced by a front end robot with a vertical range that enables vertical stacking of two or more loadlock/process chamber assemblies. By stacking the chamber assemblies and optimizing the overall layout, the footprint of the system can be minimized. Providing a single-axis transfer arm for each process chamber increases process chamber throughput by simplifying the path of each wafer into the process chambers and reducing wafer loading/unloading time for each process chamber. Providing a dual-wafer transfer system increases throughput of each process chamber by minimizing the wafer loading/unloading time by simultaneously transferring an unprocessed wafer and a processed wafer between respective loadlock and process chambers. Providing a cooling plate in each loadlock further increases throughput of each process chamber and of the entire processing system by enabling cooling and removal of processed wafers to occur in parallel with processing of other wafers.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents. All publications and patent applications cited in this specification are herein incorporated by reference as if each individual publication or patent application were specifically and individually indicated to be incorporated by reference.

What is claimed is:

1. A semiconductor wafer process apparatus comprising:

a dual-wafer single-axis transfer arm adapted to carry and transfer semiconductor wafers between a loadlock chamber and a semiconductor wafer process chamber, said transfer arm having a monolithic arm pivotally mounted within said loadlock chamber about a single pivot axis;

wherein said transfer arm is adapted to carry at least two wafers simultaneously between said loadlock chamber and said process chamber; and wherein said transfer arm comprises a retracted home position and an extended position in which said transfer arm extends into said process chamber, wherein said single pivot axis allows said transfer arm to pivot between said retracted and extended positions.

2. The semiconductor wafer process apparatus according to claim 1 further comprising a cooling plate disposed below said transfer arm when said pivot arm is in said retracted position.

3. The semiconductor wafer process apparatus according to claim 2 wherein said cooling plate further comprises a plurality of lift pins for transporting the wafers between said cooling plate and said transfer arm.

4. The semiconductor wafer process apparatus according to claim 1 wherein the transfer arm comprises an end effector, said effector comprising an upper shelf and a lower shelf with wafer edge supports thereon respectively and being coupled to the monolithic transfer arm, said effector pivoting with the monolithic arm about said pivot axis.

5. A semiconductor wafer process apparatus according to claim 1 wherein said transfer arm further comprises a lower wafer shelf for carrying a processed wafer and an upper wafer shelf for carrying an unprocessed wafer.

6. A semiconductor wafer processing apparatus according to claim 1 wherein said transfer arm is adopted to simultaneously carry one unprocessed wafer and one processed wafer.

* * * * *